US012133369B2

(12) United States Patent
Yoshimi et al.

(10) Patent No.: US 12,133,369 B2
(45) Date of Patent: Oct. 29, 2024

(54) POWER CONVERSION DEVICE

(71) Applicant: Mitsubishi Electric Corporation, Tokyo (JP)

(72) Inventors: Yuta Yoshimi, Tokyo (JP); Kenta Fujii, Tokyo (JP); Yuji Shirakata, Tokyo (JP); Hiroyuki Yahara, Tokyo (JP); Hiroyuki Kiyonaga, Tokyo (JP); Tomohito Fukuda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 226 days.

(21) Appl. No.: 17/916,854

(22) PCT Filed: May 19, 2021

(86) PCT No.: PCT/JP2021/018982
§ 371 (c)(1),
(2) Date: Oct. 4, 2022

(87) PCT Pub. No.: WO2021/235485
PCT Pub. Date: Nov. 25, 2021

(65) Prior Publication Data
US 2023/0164958 A1 May 25, 2023

(30) Foreign Application Priority Data

May 21, 2020 (JP) ................................ 2020-088943

(51) Int. Cl.
H05K 7/20 (2006.01)
H02M 3/00 (2006.01)
(Continued)

(52) U.S. Cl.
CPC ............ *H05K 7/209* (2013.01); *H02M 3/003* (2021.05); *H02M 3/33569* (2013.01);
(Continued)

(58) Field of Classification Search
CPC ........ H05K 7/209; H05K 1/181; H05K 1/148; H05K 1/327; H05K 3/366; H02M 3/003;
(Continued)

(56) References Cited

U.S. PATENT DOCUMENTS 9,578,788 B2 * 2/2017 Tang .................. H05K 7/20927
2009/0322149 A1 12/2009 Kishibata

FOREIGN PATENT DOCUMENTS

JP 3086623 B2 9/2000
JP 2008305949 A 12/2008
(Continued)

OTHER PUBLICATIONS

International Search Report (PCT/ISA/210) with translation and Written Opinion (PCT/ISA/237) mailed on Jul. 27, 2021, by the Japan Patent Office as the International Searching Authority for International Application No. PCT/JP2021/018982. (11 pages).

Primary Examiner — Zachary Pape
(74) Attorney, Agent, or Firm — BUCHANAN, INGERSOLL & ROONEY PC

(57) ABSTRACT

A power conversion device includes an electronic component, a first printed circuit board, a first cooling body, a second printed circuit board, a second cooling body, and a first wiring member. The power conversion device further includes a first insulating member. On a first main surface of the first printed circuit board, a first joint portion to which the first wiring member is joined is provided. Between a second main surface of the first printed circuit board and the first cooling body, the first insulating member is arranged on a rear surface of at least the first joint portion.

18 Claims, 25 Drawing Sheets

(51) Int. Cl.
*H02M 3/28* (2006.01)
*H02M 3/335* (2006.01)
*H05K 1/14* (2006.01)
*H05K 1/18* (2006.01)
*H05K 3/36* (2006.01)

(52) U.S. Cl.
CPC ............. *H05K 1/181* (2013.01); *H02M 3/285* (2013.01); *H02M 3/33573* (2021.05); *H05K 1/148* (2013.01); *H05K 3/366* (2013.01)

(58) Field of Classification Search
CPC ............. H02M 3/33569; H02M 3/285; H02M 3/33573
See application file for complete search history.

(56) References Cited

FOREIGN PATENT DOCUMENTS

| | | | |
|---|---|---|---|
| JP | 4231626 | B2 | 3/2009 |
| JP | 2009165327 | A | 7/2009 |
| JP | 2010010468 | A | 1/2010 |
| JP | 2010124607 | A * | 6/2010 |
| JP | 2010187504 | A | 8/2010 |
| JP | 2020178406 | A | 10/2020 |
| WO | 2020241423 | A1 | 12/2020 |

* cited by examiner

POWER CONVERSION DEVICE

TECHNICAL FIELD

The present disclosure relates to a power conversion device and a method of manufacturing a power conversion device.

BACKGROUND ART

In general, a power conversion device includes such electronic components as a switching element, a rectifier element, and a magnetic component. Such electronic components generate heat as the power conversion device operates. Heat generated in these electronic components conducts through a heat radiation path to a cooling body and radiated from the cooling body. A temperature of these electronic components is thus suppressed to a temperature not higher than an allowable temperature of each electronic component.

With higher demand for a smaller size and higher output of a power conversion device, an amount of heat generation in electronic components mounted on the power conversion device has recently increased. Therefore, enhancement of heat radiation performance of the power conversion device and suppression of temperature increase of the power conversion device have strongly been demanded.

Japanese Patent No. 4231626 (PTL 1) describes a motor drive apparatus for vehicle by way of example of a power conversion device. In the motor drive apparatus for vehicle described in this literature, a power conversion element which is a high-heat-generating component among electronic components accommodated in a housing is arranged on a bottom surface of the housing. The bottom surface of the housing where the power conversion element is arranged is integrated with a cooling body. A printed circuit board on which a control element is mounted is fixed to a plate-like substrate mounting member formed in the housing. Heat generated in the control element conducts to the housing through the plate-like substrate mounting member. The printed circuit board is layered on the power conversion element.

CITATION LIST

Patent Literature

PTL 1: Japanese Patent No. 4231626

SUMMARY OF INVENTION

Technical Problem

In the motor drive apparatus for vehicle described in the literature, the power conversion element which is the high-heat-generating component is arranged on the bottom surface of the housing. Therefore, increase in number of high-heat-generating components with increase in output from the power conversion device necessitates increase in area of the bottom surface of the housing for arranging these high-heat-generating components. Consequently, the power conversion device increases in size. In the motor drive apparatus for vehicle described in the literature, heat generated in the control element conducts to the housing through the plate-like substrate mounting member. Therefore, a heat radiation path is long, and consequently heat radiation performance is lowered. For the motor drive apparatus for vehicle described in the literature, a technique for electrical connection between the component and the printed circuit board is not described in detail. Therefore, for example, when two printed circuit boards are connected to each other through a harness and a screw and a terminal block to fix the harness, Joule heat generated in the screw and the terminal block increases the temperature of the power conversion device.

The present disclosure was made in view of problems above, and an object thereof is to provide a power conversion device capable of achieving suppression of increase in bottom surface area of a power conversion device, enhancement of heat radiation performance, and suppression of increase in temperature thereof, and a method of manufacturing the power conversion device.

Solution to Problem

A power conversion device in the present disclosure includes an electronic component, a first substrate, a first cooling body, a second substrate, a second cooling body, and a first wiring member. The electronic component includes a first component and a second component. The first substrate includes a first main surface on which the first component of the electronic component is mounted and a second main surface opposed to the first main surface. The first cooling body is thermally connected to the second main surface of the first substrate. The second substrate includes a third main surface on which the second component of the electronic component is mounted and a fourth main surface opposed to the third main surface. The second cooling body is thermally connected to the fourth main surface of the second substrate. A first wiring member electrically connects the first substrate and the second substrate to each other. The second cooling body extends in a direction from the second main surface of the first substrate toward the first main surface. The first wiring member is connected to the first main surface of the first substrate and the third main surface of the second substrate by any of direct connection and solder joint.

Advantageous Effects of Invention

According to the power conversion device in the present disclosure, electronic components are mounted not only on the first substrate but also on the second substrate. Therefore, even when the number of electronic components which are high-heat-generating components increases, increase in size of the first cooling body can be suppressed by mounting the electronic components on the second substrate. Therefore, increase in bottom surface area of the power conversion device can be suppressed. By mounting electronic components on the second substrate, a heat radiation distance over which heat generated in the electronic components mounted on the second substrate conducts to the second cooling body can be shorter. Therefore, heat radiation performance of the second substrate can be enhanced. The first wiring member is connected to the first main surface of the first substrate and the third main surface of the second substrate by any of direct connection and solder joint. Therefore, since a screw and a terminal block are not used for connection between substrates, Joule heat generated in the screw and the terminal block is reduced and hence increase in temperature of the first wiring member can be suppressed.

Therefore, increase in temperature of the power conversion device can be suppressed.

DESCRIPTION OF EMBODIMENTS

Figure 1:
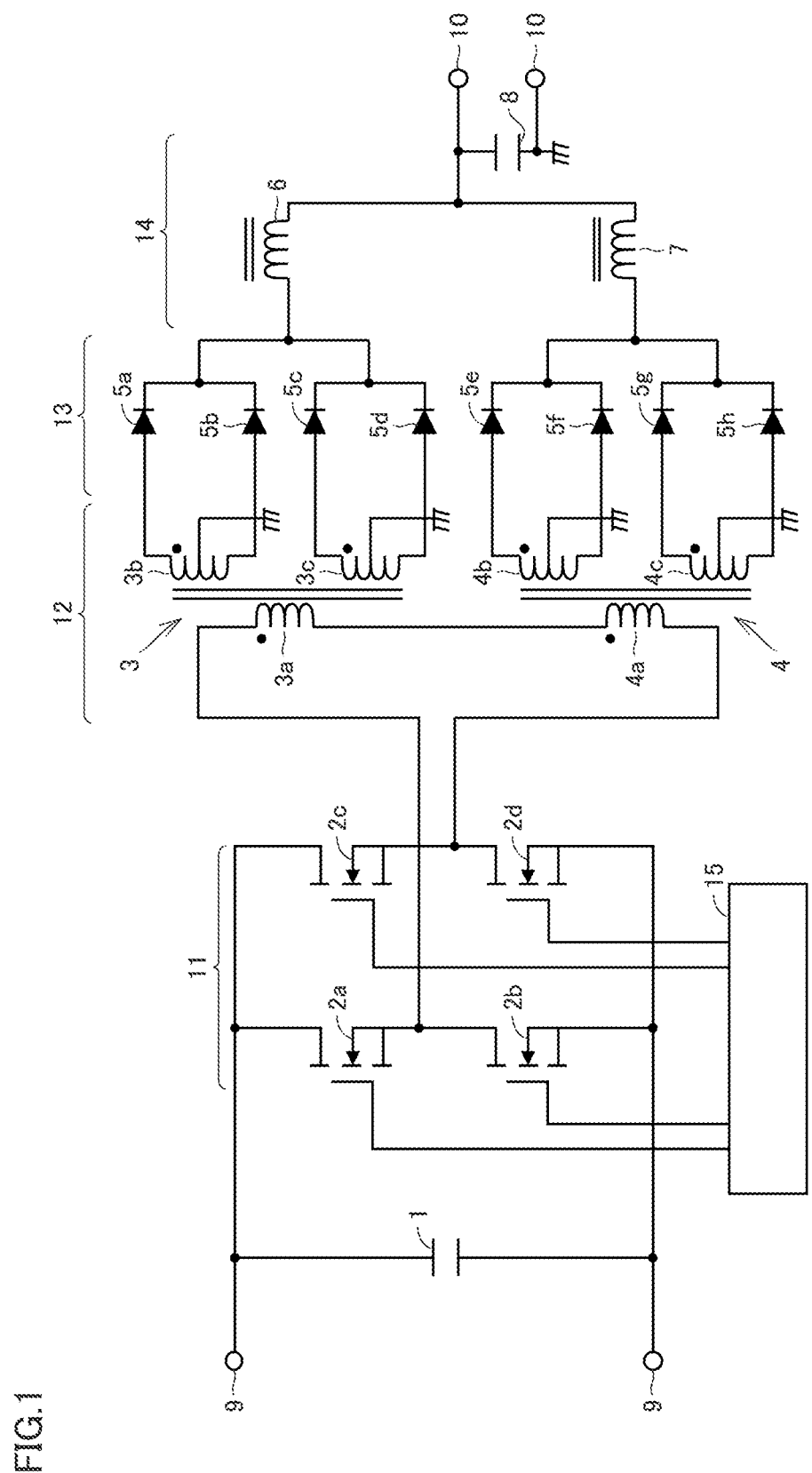
FIG. 1 is a circuit diagram of a power conversion device according to a first embodiment.

An embodiment of the present disclosure will be described below with reference to the drawings. The same or corresponding elements below have the same reference characters allotted and redundant description will not be repeated.

First Embodiment

FIG. 1 is an exemplary circuit diagram of a power conversion device according to a first embodiment. The power conversion device shown in the circuit diagram in FIG. 1 is, for example, a direct-current (DC)-DC converter mounted on an electric vehicle, the DC-DC converter converting an input voltage of a lithium ion battery of DC 100 V to 300 V to a voltage of DC 12 to 15 V and providing the resultant voltage to charge a lead acid battery. The power conversion device shown in the circuit diagram in FIG. 1 includes an input capacitor 1, an inverter circuit unit 11 constituted of four switching elements 2a, 2b, 2c, and 2d, a transforming unit 12 constituted of transformers 3 and 4, a rectifier circuit unit 13 constituted of eight rectifier elements 5a, 5b, 5c, 5d, 5e, 5f, 5g, and 5h, a smoothing circuit unit 14 constituted of reactors 6 and 7 and a smoothing capacitor 8, an input terminal 9, an output terminal 10, and a control circuit unit 15. Each electronic component shown with a circuit sign in FIG. 1 may be configured with any number of components connected in series or parallel.

Each of switching elements 2a, 2b, 2c, and 2d is a power semiconductor element such as a transistor, a metal oxide semiconductor field effect transistor (MOSFET), or an insulated gate bipolar transistor (IGBT). Rectifier elements 5a, 5b, 5c, 5d, 5e, 5f, 5g, and 5h are each a power semiconductor element such as a diode, a MOSFET, or a thyristor.

The power conversion device shown in the circuit diagram in FIG. 1 converts a DC voltage provided from input terminal 9 into an alternating-current (AC) voltage by controlling switching of inverter circuit unit 11 by means of control circuit unit 15. Transforming unit 12 converts the AC voltage obtained by conversion by inverter circuit unit 11 into any voltage based on a turns ratio of transformers 3 and 4. Transformers 3 and 4 electrically isolate input terminal 9 and output terminal 10 from each other. Rectifier circuit unit 13 converts the AC voltage supplied from transformers 3 and 4 again into a DC voltage. Smoothing circuit unit 14 smoothens the DC voltage obtained by conversion by rectifier circuit unit 13 to stabilize an output voltage.

In the power conversion device thus configured and shown in the circuit diagram in FIG. 1, four switching elements 2a, 2b, 2c, and 2d, transformers 3 and 4, eight rectifier elements 5a, 5b, 5c, 5d, 5e, 5f, 5g, and 5h, and reactors 6 and 7 fall under high-heat-generating components. Heat generated in these high-heat-generating components should be radiated to lower a temperature of the high-heat-generating components to a temperature not higher than an allowable temperature of each component.

The allowable temperature of each component is, for example, not lower than 100° C. and not higher than 120° C.

Since a high current flows through a line that electrically connects these high-heat-generating components to each other, an electrical resistance of the line itself causes generation of Joule heat therein. Therefore, the line itself that electrically connects the high-heat-generating components to each other also generates a large amount of heat. Therefore, when high-heat-generating components are electrically connected to each other in a circuit pattern formed on or in the inside of a printed circuit board, heat generated in the circuit pattern should be radiated to lower the temperature of the printed circuit board to a temperature not higher than the allowable temperature. The allowable temperature of the printed circuit board is, for example, not lower than 100° C. and not higher than 120° C.

Figure 2:
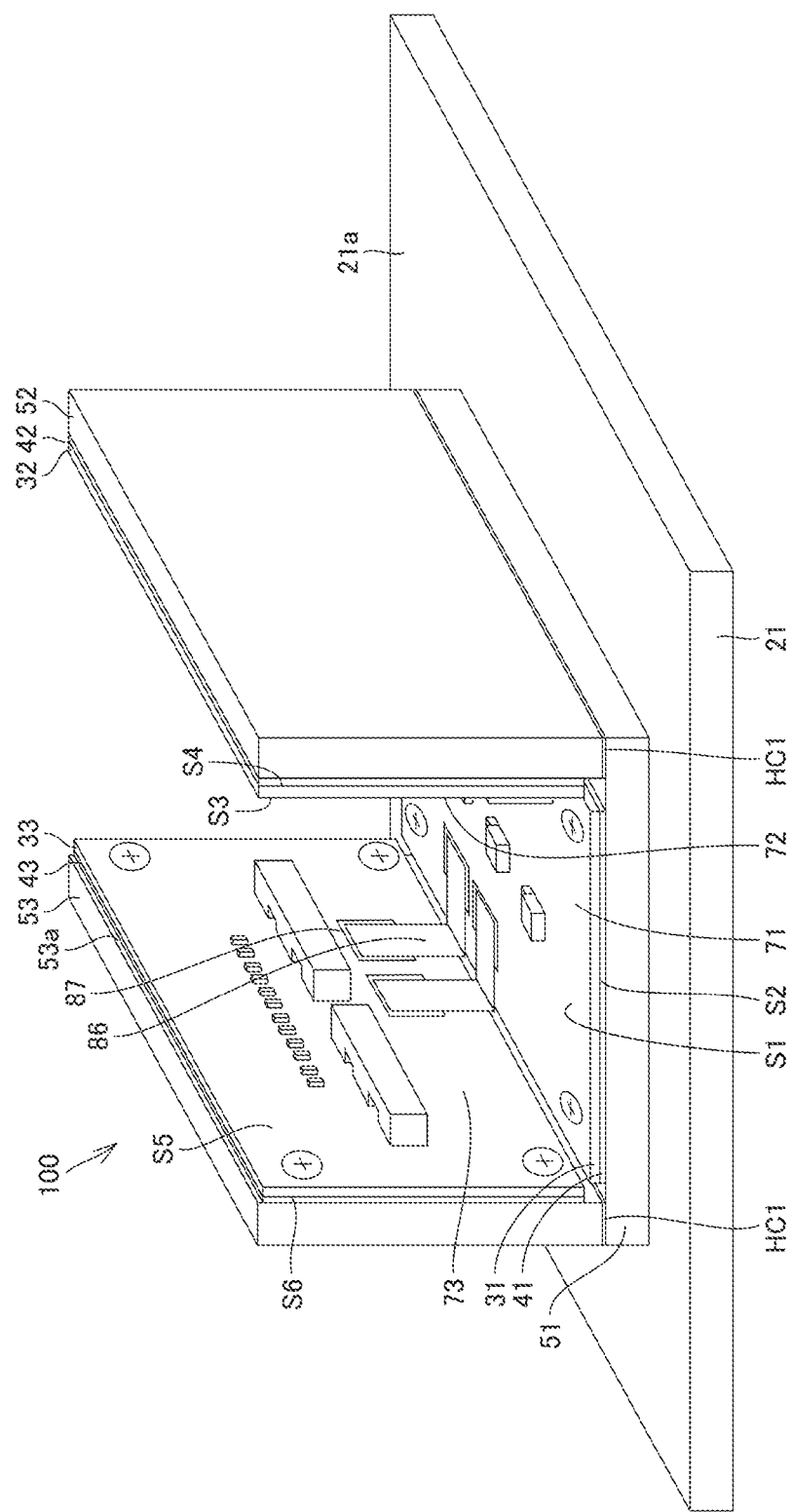
FIG. 2 is a perspective view schematically showing a construction of the power conversion device according to the first embodiment.
Figure 3:
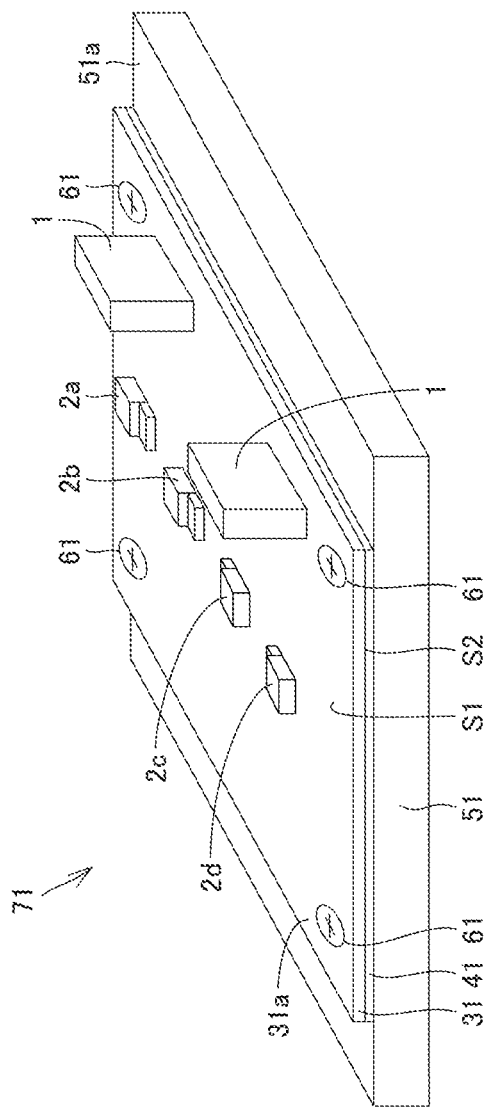
FIG. 3 is a perspective view schematically showing a construction of a first printed circuit board module of the power conversion device according to the first embodiment.
Figure 4:
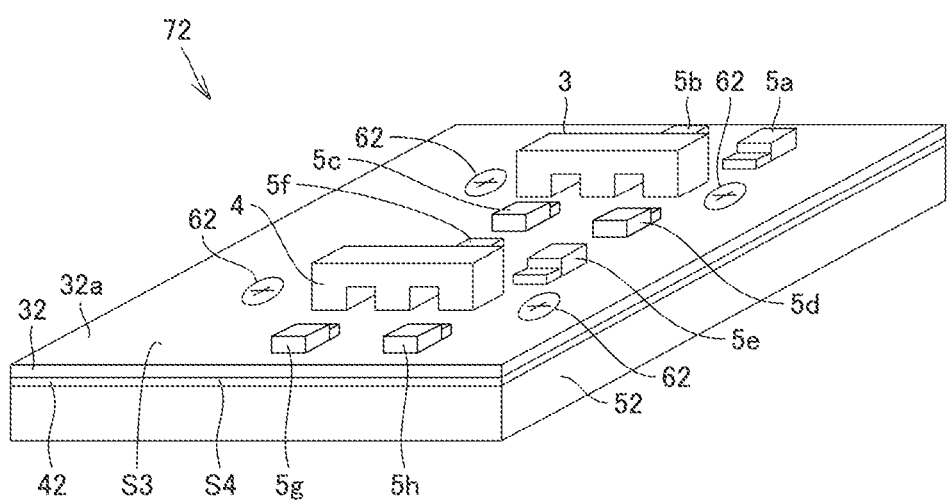
FIG. 4 is a perspective view schematically showing a construction of a second printed circuit board module of the power conversion device according to the first embodiment.
Figure 5:
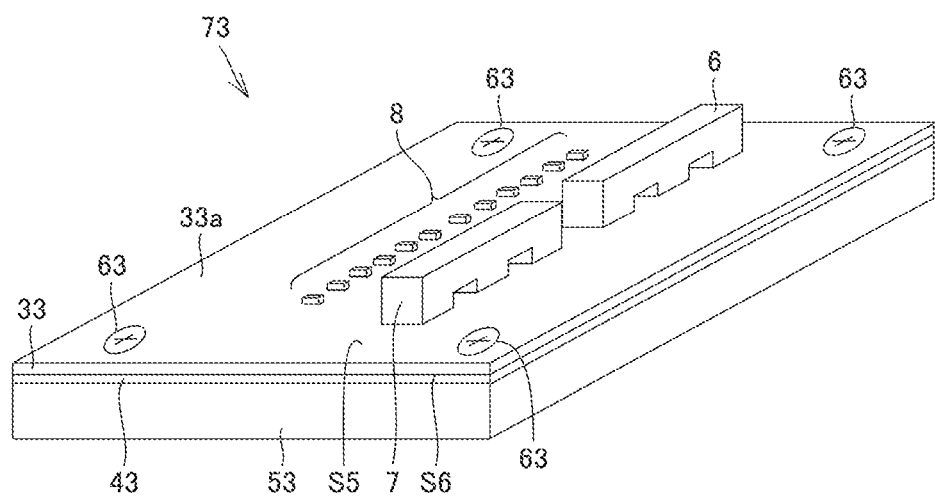
FIG. 5 is a perspective view schematically showing a construction of a third printed circuit board module of the power conversion device according to the first embodiment.

FIG. 2 is a perspective view of a power conversion device 100 according to the first embodiment. FIG. 3 is a perspective view of a first printed circuit board module 71 included in power conversion device 100. FIG. 4 is a perspective view of a second printed circuit board module 72 included in power conversion device 100. FIG. 5 is a perspective view of a third printed circuit board module 73 included in power conversion device 100. For the sake of convenience of description, FIGS. 2 to 5 do not show a wiring member 86 and a joint portion 87 which will be described later.

As shown in FIGS. 2 to 5, power conversion device 100 includes an external cooling body 21, a first printed circuit board 31, a first insulating member 41, a first cooling body 51, a first fixing member 61, a second printed circuit board 32, a second insulating member 42, a second cooling body 52, a second fixing member 62, a third printed circuit board 33, a third insulating member 43, a third cooling body 53, a third fixing member 63, an electronic component, and wiring member 86. External cooling body 21 includes a main surface 21a.

First printed circuit board (a first substrate) 31 includes a front surface (a first main surface) S1 on which an electronic component (a first component) is mounted and a rear surface (a second main surface) S2 opposed to first cooling body 51. Second main surface S2 is opposed to first main surface S1. First insulating member 41 is arranged between second main surface S2 of first printed circuit board 31 and first cooling body 51. First cooling body 51 is thermally connected to second main surface S2 of first printed circuit board 31. First cooling body 51 is thermally connected to second main surface S2 of first printed circuit board 31 with first insulating member 41 being interposed. First cooling body 51 is thermally coupled to external cooling body 21. External cooling body 21 is thermally connected to first cooling body 51. First cooling body 51 is thermally connected to second main surface S2 of first printed circuit board 31. First fixing member 61 is constructed to fix first printed circuit board 31 to first cooling body 51.

Second printed circuit board (a second substrate) 32 includes a front surface (a third main surface) S3 on which an electronic component (a second component) is mounted and a rear surface (a fourth main surface) S4 opposed to second cooling body 52. Fourth main surface S4 is opposed to third main surface S3. Second insulating member 42 is arranged between fourth main surface S4 of second printed circuit board 32 and second cooling body 52. Second cooling body 52 is thermally connected to fourth main surface S4 of second printed circuit board 32. Second cooling body 52 is thermally connected to fourth main surface S4 of second printed circuit board 32 with second insulating member 42 being interposed. Second cooling body 52 is constructed to vertically extend with a surface connected to a surface S1a of first cooling body 51 opposed to first printed circuit board 31 being defined as a bottom surface. Second cooling body 52 extends in a direction from second main surface S2 of first printed circuit board 31 toward first main surface S1. Second cooling body 52 is thermally connected to first cooling body 51. Second fixing member 62 is constructed to fix second printed circuit board 32 to second cooling body 52.

Third printed circuit board (a third substrate) 33 includes a front surface (a fifth main surface) S5 on which an electronic component (a third component) is mounted and a rear surface (a sixth main surface) S6 opposed to third cooling body 53. Sixth main surface S6 is opposed to fifth main surface S5. Third insulating member 43 is arranged between sixth main surface S6 of third printed circuit board 33 and third cooling body 53. Third cooling body 53 is thermally connected to sixth main surface S6 of third printed circuit board 33. Third cooling body 53 is thermally connected to sixth main surface S6 of third printed circuit board 33 with third insulating member 43 being interposed. Third cooling body 53 is constructed to vertically extend with a surface connected to surface S1a of first cooling body 51 being defined as a bottom surface. Third cooling body 53 extends in the direction from second main surface S2 of first printed circuit board 31 toward first main surface S1. Third cooling body 53 is thermally connected to first cooling body 51. Third fixing member 63 is constructed to fix third printed circuit board 33 to third cooling body 53.

Each of second printed circuit board 32 and third printed circuit board 33 extends in the direction from second main surface S2 of first printed circuit board 31 toward first main surface S1. Second printed circuit board 32 and third printed circuit board 33 are arranged to face each other.

In the present embodiment, first printed circuit board 31, the second printed circuit board, and third printed circuit board 33 are constructed in a space defined by the cooling bodies.

Though second printed circuit board 32 and third printed circuit board 33 are arranged to face each other in the present embodiment, they may be arranged adjacently to each other. At that time, second printed circuit board 32 and third printed circuit board 33 are thermally coupled to each other.

The vertical direction is defined as a direction substantially perpendicular to main surface 21a of external cooling body 21. First cooling body 51 defines a bottom surface of a support body of power conversion device 100. Second cooling body 52 and third cooling body 53 each define a side surface of the support body of power conversion device 100.

Input power is connected to first printed circuit board 31 (not shown) from an upper opening of second cooling body 52 or third cooling body 53, for example, through a harness or a line of the printed circuit board.

Output power is provided from second printed circuit board 32 or third printed circuit board 33. For example, a harness or a line of the printed circuit board for providing output power is connected to second printed circuit board 32 or third printed circuit board 33 (not shown) from an upper opening of the housing.

Control circuit unit 15 is arranged above second cooling body 52 or third cooling body 53 (not shown).

External cooling body 21 has a thermal conductivity not lower than 1.0 W/(m·K), preferably not lower than 10.0 W/(m·K), and further preferably not lower than 100.0 W/(m·K). External cooling body 21 is formed of a metal material such as copper, iron, aluminum, an iron alloy, or an aluminum alloy or a resin high in thermal conductivity.

External cooling body 21 may include a pipe for passage of cooling water therein. External cooling body 21 may include a heat radiation fin for promoting heat radiation to the atmosphere therearound.

A not-shown circuit pattern may be formed on a surface or in the inside of each of first printed circuit board 31, second printed circuit board 32, and third printed circuit board 33. This circuit pattern has a thickness not smaller than 1 µm and not larger than 2000 µm. This circuit pattern is formed of a conductive material. This circuit pattern is formed, for example, of copper, nickel, gold, aluminum, silver, or tin, or an alloy thereof. First printed circuit board 31, second printed circuit board 32, and third printed circuit board 33 may each be composed, for example, of a glass fiber reinforced epoxy resin, a phenol resin, polyphenylene sulfide (PPS), or polyether ether ketone (PEEK). In other words, each of first printed circuit board 31, second printed circuit board 32, and third printed circuit board 33 may be composed of a material generally assumed as being low in thermal conductivity. In other words, each of first printed circuit board 31, second printed circuit board 32, and third printed circuit board 33 may be a general-purpose printed circuit board. Each of first printed circuit board 31, second printed circuit board 32, and third printed circuit board 33 may be composed of ceramics such as aluminum oxide, aluminum nitride, or silicon carbide.

Each of first insulating member 41, second insulating member 42, and third insulating member 43 is electrically insulating. Each of first insulating member 41, second insulating member 42, and third insulating member 43 may be elastic. Each of first insulating member 41, second insulating member 42, and third insulating member 43 may have a Young's modulus not lower than 1 MPa and not higher than 100 MPa. Each of first insulating member 41, second insulating member 42, and third insulating member 43 has a thermal conductivity not lower than 0.1 W/(m·K) and preferably not lower than 1.0 W/(m·K). Each of first insulating member 41, second insulating member 42, and third insulating member 43 may be composed, for example, of a rubber material such as silicon or urethane, a resin material such as acrylonitrile butadiene styrene (ABS), polybutylene terephthalate (PBT), polyphenylene sulfide (PPS), or phenol, a polymeric material such as polyimide, a ceramic material such as alumina or aluminum nitride, or a phase change material mainly composed of silicon. Each of first insulating member 41, second insulating member 42, and third insulating member 43 may be composed of a material obtained by mixing particles of aluminum oxide, aluminum nitride, or boron nitride in a silicon resin.

Each of first cooling body 51, second cooling body 52, and third cooling body 53 has a thermal conductivity not lower than 1.0 W/(m·K), preferably not lower than 10.0 W/(m·K), and further preferably not lower than 100.0 W/(m·K). Each of first cooling body 51, second cooling body 52, and third cooling body 53 is formed of a metal material such as copper, iron, aluminum, an iron alloy, or an aluminum alloy, or a resin high in thermal conductivity. In the present embodiment, first cooling body 51, second cooling body 52, and third cooling body 53 are composed of an aluminum alloy in a form of a plate. First cooling body 51, second cooling body 52, and third cooling body 53 may electrically be connected to another member to be equal in potential to the ground. Each of second cooling body 52 and third cooling body 53 is connected and fixed to first cooling body 51 directly or with another member being interposed. Each of second cooling body 52 and third cooling body 53 is thermally connected to first cooling body 51.

A thermally conductive member (a first thermally conductive member) HC1 such as thermally conductive grease, a thermally conductive sheet, or a thermally conductive adhesive may be arranged on a surface of contact between first cooling body 51 and second cooling body 52 and a surface of contact between first cooling body 51 and third cooling body 53. Thermally conductive member (first thermally conductive member) HC1 includes at least any one of the thermally conductive grease, the thermally conductive sheet, and the thermally conductive adhesive. First cooling body 51 is thermally connected to each of second cooling body 52 and third cooling body 53 with thermally conductive member (first thermally conductive member) HC1 being interposed.

First cooling body 51 may be in surface contact with external cooling body 21. When first cooling body 51 and external cooling body 21 are in surface contact with each other, the thermally conductive member such as the thermally conductive grease, the thermally conductive sheet, or the thermally conductive adhesive may be arranged on the surface of contact between first cooling body 51 and external cooling body 21.

Since first cooling body 51 and external cooling body 21 are thermally coupled to each other, performance of radiation of heat generated in first printed circuit board module 71 is higher than performance of radiation of heat generated in second printed circuit board module 72 and third printed circuit board module 73. Therefore, though electronic components arranged in first printed circuit board module 71, second printed circuit board module 72, and third printed circuit board module 73 may be interchanged, electronic components (high-heat-generating components) that generate a particularly large amount of heat are arranged preferably on first printed circuit board module 71. In the present embodiment, with each of switching elements 2a, 2b, 2c, and 2d being assumed as a particularly high-heat-generating component, each of switching elements 2a, 2b, 2c, and 2d is arranged in first printed circuit board module 71.

Rectifier elements 5a, 5b, 5c, 5e, 5f, 5g, and 5h or transformers 3 and 4 less in heat generation than the switching elements are arranged in second printed circuit board module 72 and/or third printed circuit board module 73.

Exemplary first printed circuit board module 71, second printed circuit board module 72, and third printed circuit board module 73 will be described in succession with reference to FIGS. 3 to 5.

As shown in FIG. 3, first printed circuit board module 71 includes first printed circuit board 31, first insulating member 41, first cooling body 51, first fixing member 61, and an electronic component (first electronic component). The electronic component (first component) is mounted on first printed circuit board 31. The electronic component (first component) is each of switching elements 2a, 2b, 2c and 2d that are particularly high-heat-generating components. First insulating member 41 is provided between first printed circuit board 31 and first cooling body 51. First insulating member 41 is preferably in surface contact with first printed circuit board 31 and first cooling body 51. First fixing member 61 fixes first printed circuit board 31 to first cooling body 51.

On a surface 31a of first printed circuit board 31 opposite to a surface opposed to first cooling body 51, input capacitor 1 and switching elements 2a, 2b, 2c, and 2d are mounted. Not-shown input terminal 9 is mounted on surface 31a. Other electronic components may be mounted on surface 31a. Other electronic components may be mounted on the surface of first printed circuit board 31 opposed to first cooling body 51. The surface of first printed circuit board 31 opposed to first cooling body 51 corresponds to second main surface S2. Surface 31a of first printed circuit board 31 opposite to the surface opposed to first cooling body 51 corresponds to first main surface S1.

As shown in FIG. 4, second printed circuit board module 72 includes second printed circuit board 32, second insulating member 42, second cooling body 52, second fixing member 62, and an electronic component (second component). The electronic component (second component) is mounted on second printed circuit board 32. The electronic component (second component) is transformers 3 and 4 and rectifier elements 5a, 5b, 5c, 5d, 5e, 5f, 5g, and 5h which are particularly high-heat-generating components. Second insulating member 42 is provided between fourth main surface S4 of second printed circuit board 32 and second cooling body 52. Second insulating member 42 is preferably in surface contact with second printed circuit board 32 and second cooling body 52. Second fixing member 62 fixes second printed circuit board 32 to second cooling body 52.

On a surface 32a of second printed circuit board 32 opposite to a surface opposed to second cooling body 52, rectifier elements 5a, 5b, 5c, 5d, 5e, 5f, 5g, and 5h and transformers 3 and 4 are mounted. Other electronic components may be mounted on surface 32a. Other electronic components may be mounted on the surface of second printed circuit board 32 opposed to second cooling body 52. The surface of second printed circuit board 32 opposed to second cooling body 52 corresponds to fourth main surface S4. Surface 32a of second printed circuit board 32 opposite to the surface opposed to second cooling body 52 corresponds to third main surface S3.

As shown in FIG. 5, third printed circuit board module 73 includes third printed circuit board 33, third insulating member 43, third cooling body 53, third fixing member 63, and an electronic component (third component). The electronic component (third component) is mounted on third printed circuit board 33. The electronic component (third component) is reactors 6 and 7 which are particularly high-heat-generating components. Third insulating member 43 is provided between third printed circuit board 33 and third cooling body 53. Third insulating member 43 is preferably in surface contact with third printed circuit board 33 and third cooling body 53. Third fixing member 63 fixes third printed circuit board 33 to third cooling body 53.

On a surface 33a of third printed circuit board 33 opposite to a surface opposed to third cooling body 53, smoothing capacitor 8 and reactors 6 and 7 are mounted. Not-shown output terminal 10 is mounted on surface 33a. Other electronic components may be mounted on surface 33a. Other electronic components may be mounted on the surface of third printed circuit board 33 opposed to third cooling body 53. The surface of third printed circuit board 33 opposed to third cooling body 53 corresponds to sixth main surface S6. Surface 33a of third printed circuit board 33 opposite to the surface opposed to third cooling body 53 corresponds to fifth main surface S5.

Control circuit unit 15 shown in FIG. 1 may be mounted on any of first printed circuit board 31, second printed circuit board 32, and third printed circuit board 33. Control circuit unit 15 may be mounted as being divided, on at least two of first printed circuit board 31, second printed circuit board 32, and third printed circuit board 33.

Wiring member 86 will be described in further detail with reference to FIGS. 2, 6, and 7.

As shown in FIG. 2, power conversion device 100 according to the first embodiment includes external cooling body 21, first printed circuit board module 71, second printed circuit board module 72, and third printed circuit board module 73. Wiring member 86 electrically connects first printed circuit board module 71 and second printed circuit board module 72 to each other and electrically connects first printed circuit board module 71 and third printed circuit board module 73 to each other.

Wiring member 86 includes a first wiring member 86a and a second wiring member 86b. First wiring member 86a electrically connects first printed circuit board 31 of first printed circuit board module 71 and second printed circuit board 32 of second printed circuit board module 72 to each other. Second wiring member 86b electrically connects first printed circuit board 31 of first printed circuit board module 71 and third printed circuit board 33 of third printed circuit board module 73 to each other.

First wiring member 86a is connected to first main surface S1 of first printed circuit board 31 and third main surface S3 of second printed circuit board 32 by any of direct connection and solder joint. Second wiring member 86b is joined to first main surface S1 of first printed circuit board 31 and fifth main surface S5 of third printed circuit board 33. Joint here refers to joint by soldering, ultrasonic bonding, a conductive adhesive, and welding.

Joint portion 87 is provided on first main surface S1 of first printed circuit board module 71. Joint portion 87 is provided on third main surface S3 of second printed circuit board module 72. Joint portion 87 is provided on fifth main surface S5 of third printed circuit board module 73. Wiring member 86 is electrically connected to joint portion 87. A current from 0 to 300 A flows to wiring member 86 and joint portion 87.

Wiring member 86 is formed of a conductive material. Wiring member 86 is formed of copper, nickel, gold, aluminum, silver, or tin, or an alloy thereof.

Regarding a shape of wiring member 86, too small a thickness, too small a width, or too long a length causes a large amount of heat generation at the time of conduction to wiring member 86. Therefore, the temperature of wiring member 86 increases. Therefore, the shape of wiring member 86 preferably satisfies a condition below.

Wiring member 86 has a thickness preferably not smaller than 0.05 mm and smaller than 0.3 mm. Wiring member 86 has a width preferably not smaller than 3 mm and smaller than 50 mm. Wiring member 86 has a length preferably not shorter than 10 mm and shorter than 100 mm. Wiring member 86 has a current density preferably not lower than 50 A/mm$^2$ and not higher than 100 A/mm$^2$. Wiring member 86 has an aspect ratio preferably lower than 1:300. Wiring member 86 should only have, for example, a thickness of 0.1 mm, a width of 10 mm, and a length of 50 mm and should only allow conduction of a current at 90 A.

Figure 6:
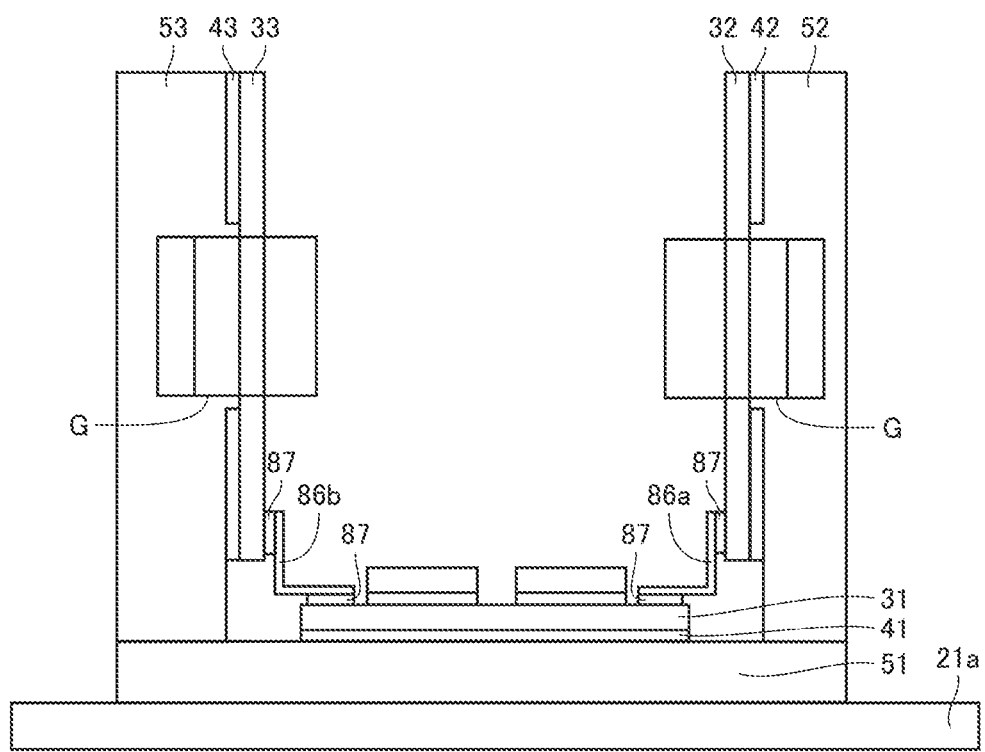
FIG. 6 is a cross-sectional view schematically showing the construction of the power conversion device according to the first embodiment.

FIG. 6 is a cross-sectional view schematically showing the construction of power conversion device 100. For the sake of convenience of description, hatching is not provided in FIG. 6.

Figure 7:
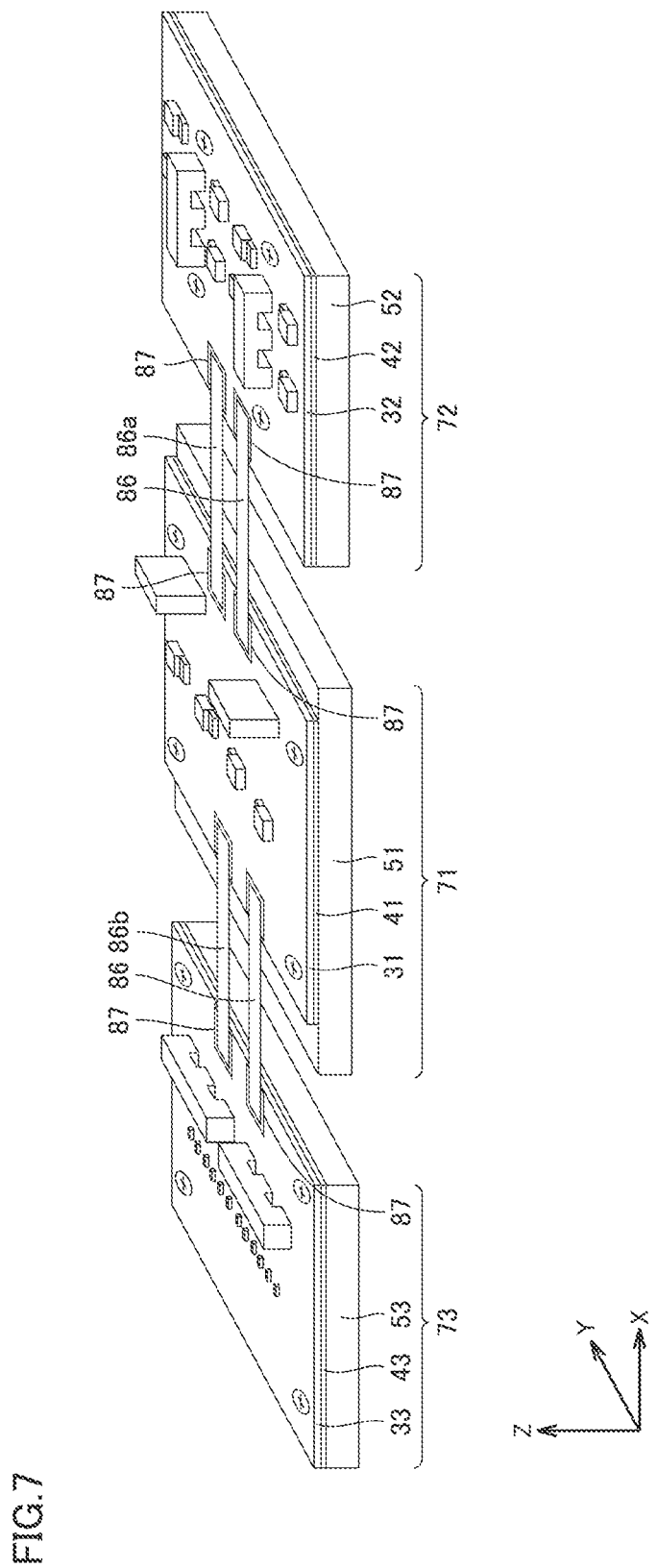
FIG. 7 is a perspective view for illustrating electrical connection between the printed circuit board modules of the power conversion device according to the first embodiment.

FIG. 7 is a developed view of first printed circuit board module 71, second printed circuit board module 72, and third printed circuit board module 73 of power conversion device 100.

With a large thickness of wiring member 86, a crack is likely in a portion of soldering between wiring member 86 and joint portion 87 when second printed circuit board module 72 and third printed circuit board module 73 are erected as shown in FIG. 6 from a state shown in FIG. 7. With a thickness smaller than 0.3 mm, when second printed circuit board module 72 and third printed circuit board module 73 are erected perpendicularly to first printed circuit board module 71 in a direction of a Z axis, deflection is produced in a direction of a Y axis. This flexed portion deforms in the direction of the Y axis to thereby absorb position displacement. Therefore, as the thickness is smaller, position displacement in the direction of the Y axis can more be absorbed.

As wiring member 86 has a smaller width, position displacement in the direction of the Y axis at the time when second printed circuit board module 72 and third printed circuit board module 73 are erected perpendicularly to first printed circuit board module 71 in the direction of the Z axis can more be absorbed.

As wiring member 86 has a longer length, position displacement in the direction of the Y axis at the time when second printed circuit board module 72 and third printed circuit board module 73 are erected perpendicularly to first printed circuit board module 71 in the direction of the Z axis can more be absorbed.

As shown in FIG. 6, wiring member 86 is bent at a right angle and connected to joint portion 87. Joint portion 87 is a part of a circuit pattern. Wiring member 86 can be bent not only at the right angle but also at any angle from 0 degree to 180 degrees. By bending wiring member 86, as shown in FIG. 6, second printed circuit board module 72 and third printed circuit board module 73 can be erected with respect to first printed circuit board module 71 in the direction of the Z axis. Therefore, each of second printed circuit board module 72 and third printed circuit board module 73 can be arranged perpendicularly to external cooling body 21. A structure obtained by assembling first printed circuit board module 71, second printed circuit board module 72, and third printed circuit board module 73 can thus be smaller in bottom surface area with respect to external cooling body 21, so that this structure can be mounted on external cooling body 21.

As shown in FIG. 7, a direction in parallel to a longitudinal direction of wiring member 86 on a rectangular thin plate is defined as an X axis and a direction perpendicular to the longitudinal direction is defined as the Y axis. A direction perpendicular to a cooling surface is defined as the direction of the Z axis. A position of joint portion 87 may be displaced in the direction of the Y axis from a designed position at the time of screwing of the printed circuit board module to the cooling body. Position displacement in the direction of the Y axis may occur at the time of connection of joint portion 87 to wiring member 86. In a state shown in FIG. 6, when second printed circuit board module 72 and third printed circuit board module 73 are erected perpendicularly to first printed circuit board module 71 in the direction of the Z axis, wiring member 86 is flexed. Therefore, wiring member 86 can absorb position displacement in the direction of the Z axis.

A method of manufacturing power conversion device 100 according to the first embodiment will now be described with reference to FIGS. 6, 7, and 8.

Figure 8:
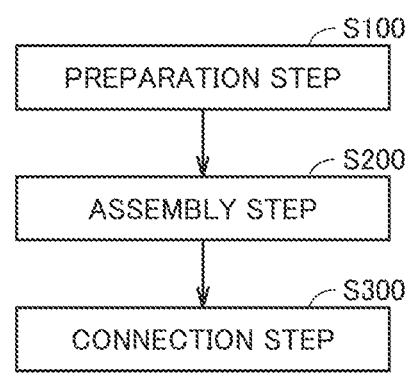
FIG. 8 is a flowchart showing a method of manufacturing a power conversion device according to the first embodiment.

As shown in FIGS. 6, 7, and 8, power conversion device 100 is manufactured through a preparation step S100, an assembly step S200, and a connection step S300.

In preparation step S100, electronic components including the first component, the second component, and the third component, first printed circuit board 31, the second printed circuit board, and third printed circuit board 33, first cooling body 51 and second cooling body 52, and wiring member 86 are prepared. The printed circuit board may be obtained by division of a single substrate. In this case, division into individual printed circuit boards is made by cutting by a rooter along perforations provided in a single substrate.

In assembly step S200, each printed circuit board may be connected by wiring member 86 with joint portion 87 being interposed. The perforations may be arranged so as not to be superimposed on wiring member 86.

In assembly step S200, each of first printed circuit board module 71, second printed circuit board module 72, and third printed circuit board module 73 is assembled. In assembly step S200, each of first printed circuit board module 71, second printed circuit board module 72, and third printed circuit board module 73 is manufactured through an electronic component mounting step, a printed circuit board combination step, and a printed circuit board fixing step.

A step of assembling first printed circuit board module 71 will be described. In the electronic component mounting step, the electronic component (first component) is mounted on first main surface S1 of first printed circuit board 31 by flow soldering or reflow soldering. In the printed circuit board combination step, first cooling body 51, first insulating member 41, and first printed circuit board 31 where the electronic component is mounted on surface 31a are combined. At this time, first cooling body 51 is thermally connected to second main surface S2 opposed to first main surface S1 of first printed circuit board 31. In the printed circuit board fixing step, first fixing member 61 fixes first printed circuit board 31 to first cooling body 51 with first insulating member 41 being interposed.

A step of assembling second printed circuit board module 72 will be described. In the electronic component mounting step, the electronic component (second component) is mounted on third main surface S3 of second printed circuit board 32 by flow soldering or reflow soldering. In the printed circuit board combination step, second cooling body 52, second insulating member 42, and second printed circuit board 32 where the electronic component is mounted on surface 32a are combined. Upper and lower cores are combined with each other. At this time, second cooling body 52 is thermally connected to fourth main surface S4 opposed to third main surface S3 of second printed circuit board 32. In the printed circuit board fixing step, second fixing member 62 fixes second printed circuit board 32 to second cooling body 52 with second insulating member 42 being interposed.

A step of assembling third printed circuit board module 73 will be described. In the electronic component mounting step, the electronic component (third component) is mounted on fifth main surface S5 of third printed circuit board 33 by flow soldering or reflow soldering. In the printed circuit board combination step, third cooling body 53, third insulating member 43, and third printed circuit board 33 where the electronic component is mounted on surface 33a are combined. Upper and lower cores are combined with each other. At this time, third cooling body 53 is thermally connected to sixth main surface S6 opposed to fifth main surface S5 of third printed circuit board 33. In the printed circuit board fixing step, third fixing member 63 fixes third printed circuit board 33 to third cooling body 53 with third insulating member 43 being interposed.

First wiring member 86a of wiring member 86 electrically connects first printed circuit board 31 and second printed circuit board 32 to each other. First wiring member 86a is connected to first main surface S1 of first printed circuit board 31 and third main surface S3 of second printed circuit board 32 by any of direct connection and solder joint. First wiring member 86a may electrically connect first printed circuit board 31 and second printed circuit board 32 to each other before first printed circuit board 31 is fixed to first cooling body 51 and before second printed circuit board 32 is fixed to second cooling body 52. First wiring member 86a may electrically connect first printed circuit board 31 and second printed circuit board 32 to each other after first printed circuit board 31 is fixed to first cooling body 51 and after second printed circuit board 32 is fixed to second cooling body 52.

Second wiring member 86b of wiring member 86 electrically connects first printed circuit board 31 and third printed circuit board 33 to each other. Second wiring member 86b is connected to first main surface S1 of first printed circuit board 31 and fifth main surface S5 of third printed circuit board 33 by any of direct connection and solder joint. First wiring member 86a may electrically connect first printed circuit board 31 and third printed circuit board 33 to each other before first printed circuit board 31 is fixed to first cooling body 51 and before third printed circuit board 33 is fixed to third cooling body 53. First wiring member 86a may electrically connect first printed circuit board 31 and third printed circuit board 33 to each other after first printed circuit board 31 is fixed to first cooling body 51 and after third printed circuit board 33 is fixed to third cooling body 53.

As shown in FIG. 7, each of second printed circuit board module 72 and third printed circuit board module 73 is electrically connected to first printed circuit board module 71 through wiring member 86. Joint portion 87 is mounted on each of first printed circuit board 31, second printed circuit board 32, and third printed circuit board 33. Wiring member 86 is electrically connected to joint portion 87. As wiring member 86 and joint portion 87 are fixed, each of second printed circuit board module 72 and third printed circuit board module 73 is electrically connected to first printed circuit board module 71. Though first printed circuit board 31 is connected to second printed circuit board 32 and third printed circuit board 33 through wiring members 86 in FIG. 7, three or more substrates may be connected to a single substrate.

Joint portion 87 is a part of the circuit pattern, and connected to joint portion 87 by soldering without using such a fastening member as a screw and a terminal block. Joint portion 87 may be connected to joint portion 87 not only by soldering but also by welding, swaging, or ultrasonic bonding.

In assembly step S200, the electronic component (second component) and the electronic component (third component) are fixed into respective grooves G provided in second printed circuit board 32 and third printed circuit board 33.

In connection step S300, each of second printed circuit board module 72 and third printed circuit board module 73 is connected and fixed to first printed circuit board module 71. At this time, second cooling body 52 is arranged to extend in the direction from second main surface S2 of first printed circuit board 31 toward first main surface S1.

Third cooling body 53 is arranged to extend in the direction from second main surface S2 of first printed circuit board 31 toward first main surface S1.

In connection step S300, second cooling body 52 included in second printed circuit board module 72 and third cooling body 53 included in third printed circuit board module 73 are connected and fixed to first cooling body 51 included in first printed circuit board module 71, directly or with another member being interposed. At this time, each of second cooling body 52 and third cooling body 53 is arranged to extend in the direction from second main surface S2 of first printed circuit board 31 toward first main surface S1. First cooling body 51 is thermally coupled to external cooling body 21 with such a method as surface contact with external cooling body 21.

In connection step S300, second cooling body 52 and third cooling body 53 are thermally connected to first cooling body 51. At that time, in assembly of second cooling body 52 and third cooling body 53 to first cooling body 51 as in FIG. 6 from the state in FIG. 7, positions of facing joint portions 87 in first printed circuit board 31 and second printed circuit board 32 and positions of facing joint portions 87 in first printed circuit board 31 and third printed circuit board 33 may be displaced. Even when the positions of joint portions 87 are displaced, connection can be maintained by deformation of wiring member 86.

Effects of Power Conversion Device 100 According to the First Embodiment Will Now be Described.

According to the power conversion device in the first embodiment, electronic components are mounted not only on first printed circuit board 31 but also on second printed circuit board 32. Therefore, even when the number of components which are high-heat-generating components increases, increase in size of first cooling body 51 can be suppressed by mounting the electronic components on second printed circuit board 32. Therefore, increase in bottom surface area of power conversion device 100 can be suppressed. By mounting the electronic components on second printed circuit board 32, the heat radiation distance over which heat generated in the electronic components mounted on second printed circuit board 32 conducts to second cooling body 52 can be shorter. Therefore, heat radiation performance of second printed circuit board 32 can be enhanced. First wiring member 86a is connected to first main surface S1 of first printed circuit board 31 and third main surface S3 of second printed circuit board 32 by any of direct connection and solder joint. Therefore, since a screw and a terminal block are not used in connection between substrates, a conduction path is accordingly shorter and an electrical resistance is lowered. Since Joule heat produced in the screw and the terminal block is thus reduced, increase in temperature of first wiring member 86a can be suppressed. Therefore, increase in temperature of power conversion device 100 can be suppressed. Consequently, power conversion device 100 according to the first embodiment can operate at high output.

According to power conversion device 100 in the first embodiment, electronic components are mounted also on third printed circuit board 33. Therefore, even when the number of electronic components which are high-heat-generating components increases, increase in size of first cooling body 51 can be suppressed by mounting the electronic components on third printed circuit board 33. Therefore, increase in bottom surface area of power conversion device 100 can be suppressed. By mounting the electronic components on third printed circuit board 33, the heat radiation path through which heat generated in the electronic components mounted on third printed circuit board 33 conducts to third cooling body 53 can be shorter. Therefore, heat radiation performance of third printed circuit board 33 can be enhanced. Second wiring member 86b is connected to first main surface S1 of first printed circuit board 31 and fifth main surface S5 of third printed circuit board 33 by any of direct connection and solder joint. Therefore, since a screw and a terminal block are not used in connection between substrates, a conduction path is accordingly shorter and an electrical resistance is lowered. Since Joule heat produced in the screw and the terminal block is thus reduced, increase in temperature of second wiring member 86b can be suppressed. Therefore, increase in temperature of power conversion device 100 can be suppressed.

Power conversion device 100 according to the first embodiment will be described in comparison to a comparative example. In the comparative example, a terminal block provided at joint portion 87 provided at an end of each of first printed circuit board 31 and second printed circuit board 32 is connected with the use of a screw and a harness. When second printed circuit board 32 is mounted with respect to first printed circuit board 31 perpendicularly and closely, the terminal block and the screw provided at joint portion 87 of second printed circuit board 32 interfere with the terminal block, the screw, and an electronic component provided at the end of first printed circuit board 31. Therefore, first printed circuit board 31 and second printed circuit board 32 should be mounted at a distance from each other so as to avoid interference between components of first printed circuit board 31 and second printed circuit board 32. Then, a volume and the bottom surface area of power conversion device 100 increase.

According to power conversion device 100 in the first embodiment, a copper plate in a form of a thin ribbon rather than the screw and the terminal block is employed as wiring member 86 between first printed circuit board 31 and second printed circuit board 32, to connect joint portions 87 of first printed circuit board 31 and second printed circuit board 32 to each other by soldering. Then, in mount of second printed circuit board 32 with respect to first printed circuit board 31 perpendicularly and closely, power conversion device 100 can be assembled without providing substrates at a distance from each other. Consequently, space-saving wiring can be realized. Therefore, power conversion device 100 according to the first embodiment can further be reduced in size.

According to power conversion device 100 in the first embodiment, a shape of wiring member 86 is larger in surface area in contact with air, as compared with an annular wiring member equal in cross-sectional area. Therefore, performance of power conversion device 100, of radiation of heat generated by conduction to the wiring member can be enhanced. Therefore, a current that flows in power conversion device 100 can be increased. Consequently, power conversion device 100 according to the first embodiment can operate at high output.

According to power conversion device 100 in the first embodiment, second printed circuit board 32 and third printed circuit board 33 are arranged to face each other. Therefore, power conversion device 100 can be reduced in size.

Power conversion device 100 according to the first embodiment includes external cooling body 21 thermally connected to first cooling body 51. A first heat radiation path for heat radiation to external cooling body 21 through first printed circuit board 31, first insulating member 41, and first cooling body 51 can be formed as a heat radiation path for radiation of heat generated in the circuit pattern formed at the surface or in the inside of first printed circuit board 31 and heat generated in switching elements 2a, 2b, 2c, and 2d which are high-heat-generating components mounted on first printed circuit board 31. Therefore, performance of power conversion device 100, of radiation of heat generated in the circuit pattern formed at the surface or in the inside of first printed circuit board 31 and heat generated in the high-heat-generating components mounted on first printed circuit board 31 can be enhanced. Consequently, power conversion device 100 according to the first embodiment can operate at high output.

When first insulating member 41 is in surface contact with first printed circuit board 31 and first cooling body 51, an area of the surface of contact between first insulating member 41 and first printed circuit board 31 and an area of the surface of contact between first insulating member 41 and first cooling body 51 can be increased. Therefore, a contact thermal resistance of the surface of contact between first insulating member 41 and first printed circuit board 31 and a contact thermal resistance of the surface of contact between first insulating member 41 and first cooling body 51 can be lowered, and thus heat radiation performance of the first heat radiation path can be enhanced. Consequently, power conversion device 100 according to the first embodiment can operate at high output.

A second heat radiation path for heat radiation to external cooling body 21 through second printed circuit board 32, second insulating member 42, second cooling body 52, and first cooling body 51 can be formed as a heat radiation path for radiation of heat generated in the circuit pattern formed at the surface or in the inside of second printed circuit board 32 and heat generated in rectifier elements 5a, 5b, 5c, 5d, 5e, 5f, 5g, and 5h and transformers 3 and 4 which are high-heat-generating components mounted on second printed circuit board 32. Since the second heat radiation path does not include the plate-like substrate mounting member as compared with the construction described in PTL 1, the heat radiation path can be shorter in length and heat radiation performance can be enhanced. Therefore, performance of power conversion device 100, of radiation of heat generated in the circuit pattern formed at the surface or in the inside of second printed circuit board 32 and heat generated in the high-heat-generating components mounted on second printed circuit board 32 can be enhanced. Consequently, power conversion device 100 according to the first embodiment can operate at high output.

When second insulating member 42 is in surface contact with second printed circuit board 32 and second cooling body 52, an area of the surface of contact between second insulating member 42 and second printed circuit board 32 and an area of the surface of contact between second insulating member 42 and second cooling body 52 can be increased. Therefore, the contact thermal resistance of the surface of contact between second insulating member 42 and second printed circuit board 32 and the contact thermal resistance of the surface of contact between second insulating member 42 and second cooling body 52 can be lowered and heat radiation performance of the second heat radiation path can be enhanced. Consequently, power conversion device 100 according to the first embodiment can operate at high output.

When a lower surface of the core is in direct contact with second cooling body 52, when the lower surface of the core is in contact with second cooling body 52 with a thermally conductive member such as the thermally conductive grease, the thermally conductive sheet, or the thermally conductive adhesive being interposed, or when the lower surface of the core is in contact with second cooling body 52 with the insulating member being interposed, heat generated in transformers 3 and 4 can be radiated to external cooling body 21 through second cooling body 52 and first cooling body 51. Therefore, performance of power conversion device 100, of radiation of heat generated in transformers 3 and 4 can be enhanced. Consequently, power conversion device 100 according to the first embodiment can operate at high output.

A third heat radiation path for heat radiation to external cooling body 21 through third printed circuit board 33, third insulating member 43, third cooling body 53, and first cooling body 51 can be formed as a heat radiation path for radiation of heat generated in the circuit pattern formed at the surface or in the inside of third printed circuit board 33 and heat generated in reactors 6 and 7 which are high-heat-generating components mounted on third printed circuit board 33. Since the third heat radiation path does not include the plate-like substrate mounting member as compared with the construction described in PTL 1, the heat radiation path can be shorter in length and heat radiation performance can be enhanced. Therefore, performance of power conversion device 100, of radiation of heat generated in the circuit pattern formed at the surface or in the inside of third printed circuit board 33 and heat generated in the high-heat-generating components mounted on third printed circuit board 33 can be enhanced. Consequently, power conversion device 100 according to the first embodiment can operate at high output.

When third insulating member 43 is in surface contact with third printed circuit board 33 and third cooling body 53, an area of the surface of contact between third insulating member 43 and third printed circuit board 33 and an area of the surface of contact between third insulating member 43 and third cooling body 53 can be increased. Therefore, the contact thermal resistance of the surface of contact between third insulating member 43 and third printed circuit board 33 and the contact thermal resistance of the surface of contact between third insulating member 43 and third cooling body 53 can be lowered and heat radiation performance of the third heat radiation path can be enhanced. Consequently, power conversion device 100 according to the first embodiment can operate at high output.

When the lower surface of the core is in direct contact with third cooling body 53, when the lower surface of the core is in contact with third cooling body 53 with a thermally conductive member such as the thermally conductive grease, the thermally conductive sheet, or the thermally conductive adhesive being interposed, or when the lower surface of the core is in contact with third cooling body 53 with the insulating member being interposed, heat generated in reactors 6 and 7 can be radiated to external cooling body 21 through third cooling body 53 and first cooling body 51. Therefore, performance of power conversion device 100, of radiation of heat generated in reactors 6 and 7 can be enhanced. Consequently, power conversion device 100 according to the first embodiment can operate at high output.

Since first cooling body 51 and external cooling body 21 are thermally coupled to each other, the first heat radiation path is higher in heat radiation performance than the second heat radiation path and the third heat radiation path. Therefore, by mounting particularly high-heat-generating electronic components among high-heat-generating electronic components on first printed circuit board 31, performance of power conversion device 100, of radiation of heat generated in those components can be enhanced. Consequently, power conversion device 100 according to the first embodiment can operate at high output.

The thickness of first cooling body 51 in a direction substantially perpendicular to surface 31a of first printed circuit board 31 is preferably small. Since the first heat radiation path, the second heat radiation path, and the third heat radiation path can thus be shorter in length, heat radiation performance can be enhanced.

The thickness of second cooling body 52 in a direction substantially perpendicular to surface 32a of second printed circuit board 32 is preferably large. Since a thermal resistance of second cooling body 52 included in the second heat radiation path can thus be lowered, heat radiation performance can be enhanced.

The thickness of third cooling body 53 in a direction substantially perpendicular to surface 33a of third printed circuit board 33 is preferably large. Since a thermal resistance of third cooling body 53 included in the third heat radiation path can thus be lowered, heat radiation performance can be enhanced.

In power conversion device 100 according to the first embodiment, first cooling body 51 can thermally be connected to first printed circuit board 31 with first insulating member 41 being interposed. Second cooling body 52 can thermally be connected to second printed circuit board 32 with second insulating member 42 being interposed. Third cooling body 53 can thermally be connected to third printed circuit board 33 with third insulating member 43 being interposed.

In power conversion device 100 according to the first embodiment, second cooling body 52 is thermally connected to first cooling body 51 and third cooling body 53 is thermally connected to first cooling body 51. Therefore, heat generated in electronic components mounted on second printed circuit board 32 can be radiated through second cooling body 52 from first cooling body 51, and heat generated in electronic components mounted on third printed circuit board 33 can be radiated through third cooling body 53 from first cooling body 51.

In power conversion device 100 according to the first embodiment, first cooling body 51 is thermally connected to each of second cooling body 52 and third cooling body 53 through first thermally conductive member HC1. Therefore, with first thermally conductive member HC1, heat conduction efficiency from second cooling body 52 to first cooling body 51 can be enhanced and heat conduction efficiency from third cooling body 53 to first cooling body 51 can be enhanced.

According to power conversion device 100 in the first embodiment, wiring member 86 has a thickness not smaller than 0.05 mm and smaller than 0.3 mm and a current density not lower than 50 A/mm$^2$ and not lower than 100/mm$^2$. Therefore, conduction of a high current to wiring member 86 having a small thickness can be achieved.

In the construction described in PTL 1, electronic components are arranged in the space provided in the housing. When the printed circuit board is fixed to the bottom surface and the side surface of the housing with the insulating member being interposed in the construction described in PTL 1 as in the present embodiment, arrangement of the insulating members, arrangement of the printed circuit boards, fixing of the printed circuit boards, and electrical connection of the printed circuit boards to each other should be done in the substantially surrounded space and hence workability is poor. Consequently, variation in thickness of the insulating member is likely and thermal design taking into account that fact is required.

In contrast, the method of manufacturing power conversion device 100 according to the first embodiment includes preparation step S100, assembly step S200, and connection step S300. Therefore, it is not necessary to do works to arrange first insulating member 41, second insulating member 42, and third insulating member 43 on first cooling body 51 that defines the bottom surface of the support body and second cooling body 52 and third cooling body 53 that define the side surfaces of the support body and to fix first printed circuit board 31, second printed circuit board 32, and third printed circuit board 33 and works to electrically connect first printed circuit board module 71, second printed circuit board module 72, and third printed circuit board module 73 to one another within the substantially surrounded space. Consequently, thermal design in consideration of variation in thickness of first insulating member 41, second insulating member 42, and third insulating member 43 due to poor workability is not required.

In the method of manufacturing power conversion device 100 according to the first embodiment, second cooling body 52 is arranged to extend in the direction from second main surface S2 of first printed circuit board 31 toward first main surface S1. First wiring member 86a electrically connects first printed circuit board 31 and second printed circuit board 32 to each other. First wiring member 86a is connected to first main surface S1 of first printed circuit board 31 and third main surface S3 of second printed circuit board 32 by any of direct connection and solder joint. Therefore, power conversion device 100 can be reduced in size, heat radiation performance thereof can be enhanced, and increase in temperature of power conversion device 100 can be suppressed.

According to the method of manufacturing power conversion device 100 according to the first embodiment, switching elements 2a, 2b, 2c, and 2d which are high-heat-generating components are arranged in first printed circuit board module 71. Rectifier elements 5a, 5b, 5c, 5d, 5e, 5f, 5g, and 5h or transformers 3 and 4 less in heat generation than the switching elements are arranged in second printed circuit board module 72 and third printed circuit board module 73. The high-heat-generating components can thus lower a thermal resistance to the external cooling body. Therefore, power conversion device 100 can be reduced in size, heat radiation performance thereof can be enhanced, and increase in temperature of power conversion device 100 can be suppressed.

In the method of manufacturing power conversion device 100 according to the first embodiment, third cooling body 53 is arranged to extend in the direction from second main surface S2 of first printed circuit board 31 toward first main surface S1. Second wiring member 86b electrically connects first printed circuit board 31 and third printed circuit board 33 to each other. Second wiring member 86b is connected to first main surface S1 of first printed circuit board 31 and fifth main surface S5 of third printed circuit board 33 by any of direct connection and solder joint. Therefore, power conversion device 100 can be reduced in size, heat radiation performance thereof can be enhanced, and increase in temperature of power conversion device 100 can be suppressed.

In the method of manufacturing power conversion device 100 according to the first embodiment, in connection step S300, second cooling body 52 and third cooling body 53 are thermally connected to first cooling body 51. Therefore, power conversion device 100 can be reduced in size, heat radiation performance thereof can be enhanced, and increase in temperature of power conversion device 100 can be suppressed.

In the method of manufacturing power conversion device 100 according to the first embodiment, in assembly step S200, the electronic component (second component) and the electronic component (third component) are fixed into respective grooves G provided in second printed circuit board 32 and third printed circuit board 33. Therefore, power conversion device 100 can be reduced in size, heat radiation performance thereof can be enhanced, and increase in temperature of power conversion device 100 can be suppressed. Furthermore, the electronic components can reliably be fixed.

Power conversion device 100 according to a modification of the first embodiment will now be described. The modification of the first embodiment is identical in construction, operations, and effects to the first embodiment unless particularly described. Therefore, features the same as those in the first embodiment have the same reference characters allotted and description will not be repeated.

Figure 9:
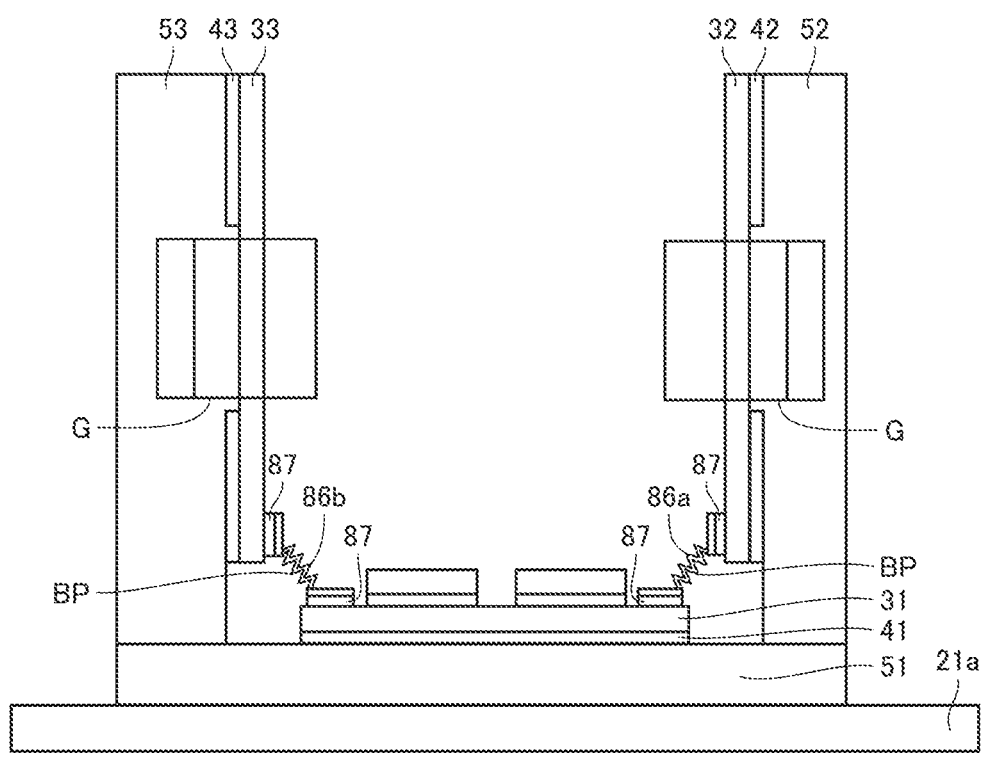
FIG. 9 is a cross-sectional view schematically showing the construction of the power conversion device according to a first modification of the first embodiment.

Power conversion device 100 according to a first modification of the first embodiment will be described with reference to FIG. 9. FIG. 9 is a cross-sectional view showing a state after assembly of first cooling body 51, second cooling body 52, and third cooling body 53 as in FIG. 2. For the sake of convenience of description, hatching is not provided in FIG. 9.

Power conversion device 100 according to the first modification of the first embodiment is basically similar in construction to power conversion device 100 according to the first embodiment. Power conversion device 100 according to the first modification of the first embodiment is different from power conversion device 100 according to the first embodiment in shape of wiring member 86.

In a state similar to the state in FIG. 7 before assembly of first cooling body 51, second cooling body 52, and third cooling body 53, wiring member 86 is in a linear shape. Pleat lines are provided in advance in wiring member 86 such that wiring member 86 is folded a plurality of times when the printed circuit board module is erected. Thereafter, as shown in FIG. 9, wiring member 86 is formed like bellows including a plurality of bent portions BP. In other words, wiring member 86 includes the plurality of bent portions BP. Adjacent bent portions BP of the plurality of bent portions BP are arranged as being superimposed on each other.

An effect of power conversion device 100 according to the first modification of the first embodiment will now be described. According to power conversion device 100 according to the first modification of the first embodiment, wiring member 86 includes the plurality of bent portions BP and hence wiring member 86 is reduced in size by being folded. Adjacent bent portions BP of the plurality of bent portions BP are arranged as being superimposed on each other. Therefore, when wiring member 86 is bent, crests of bent wiring member 86 are superimposed on each other and a conduction path in wiring member 86 becomes shorter. An electrical resistance of wiring member 86 is thus further lowered and hence heat generation can be reduced. Consequently, power conversion device 100 according to the first modification of the first embodiment can operate at high output.

Power conversion device 100 according to a second modification of the first embodiment will be described with reference to FIGS. 10 and 11. For the sake of convenience of description, hatching is not provided in FIG. 11.

Power conversion device 100 according to the second modification of the first embodiment is basically similar in construction to power conversion device 100 according to the first embodiment. Power conversion device 100 according to the second modification of the first embodiment is different from power conversion device 100 according to the first embodiment in shape of wiring member 86.

Figure 10:
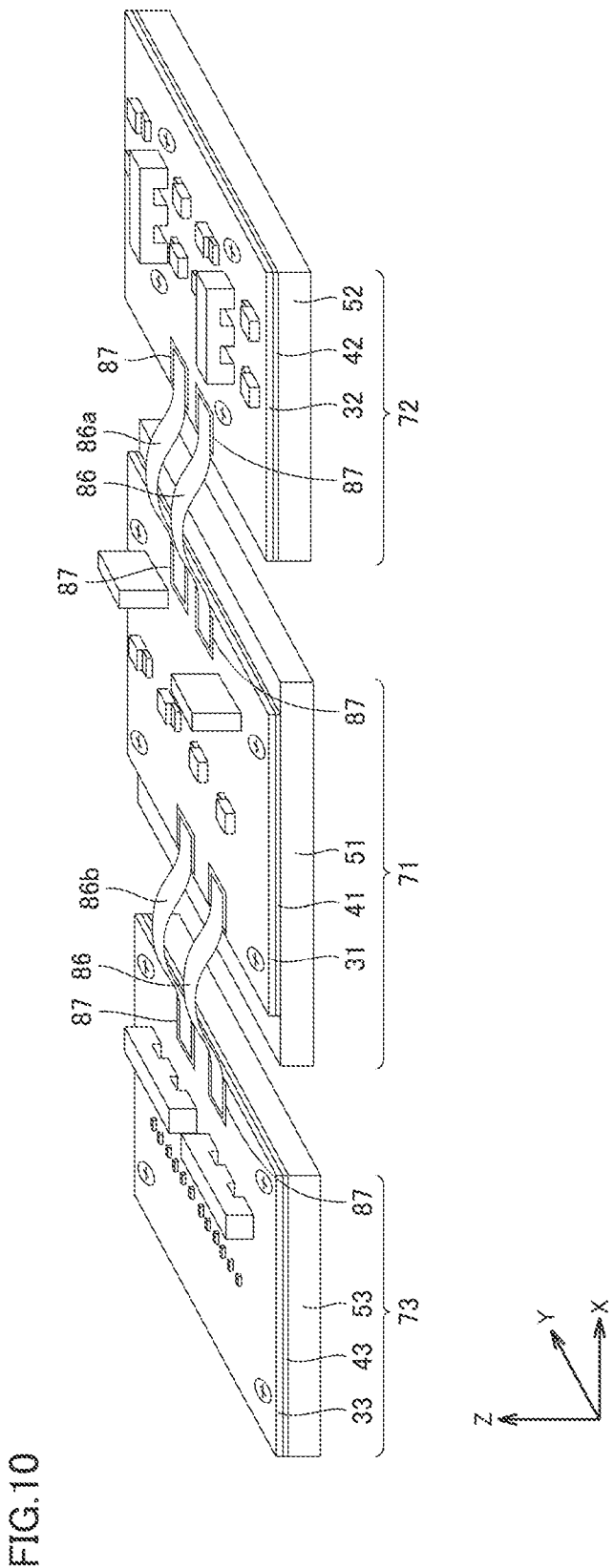
FIG. 10 is a perspective view for illustrating electrical connection between the printed circuit board modules of the power conversion device according to a second modification of the first embodiment.

As shown in FIG. 10, in a state before first cooling body 51, second cooling body 52, and third cooling body 53 are assembled, wiring member 86 is warped like an arch in advance in a positive direction along the Z axis and is in a structure where a space is provided under a central portion thereof. Wiring member 86 is in a curved shape as being adjacent to joint portions 87 at opposing ends thereof. A component can be placed in the space under the central portion of wiring member 86 warped in the positive direction along the Z axis.

Figure 11:
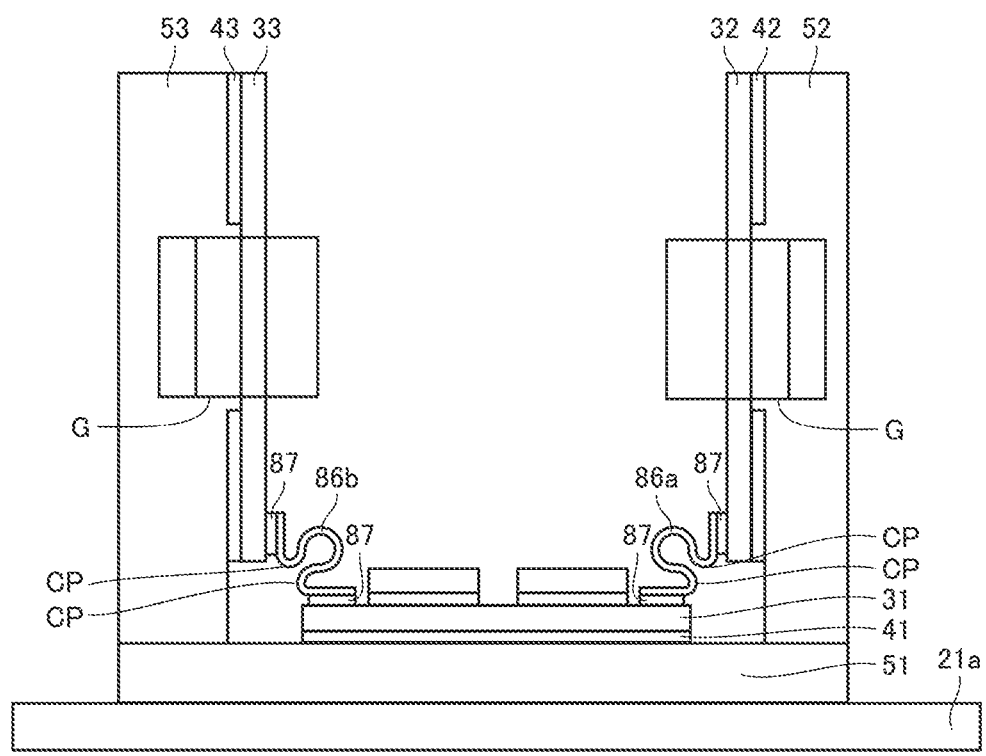
FIG. 11 is a cross-sectional view schematically showing the construction of the power conversion device according to the second modification of the first embodiment.

In a state shown in FIG. 11, the center of wiring member 86 is curved like an arc and wiring member 86 is in a shape opposed to joint portions 87, so that two curved portions CP provided in wiring member 86 are proximate to each other. Curved portions CP of wiring member 86 may be provided adjacently to ends of first printed circuit board 31, second printed circuit board 32, and third printed circuit board 33, and curved portions CP of wiring member 86 may be in contact with each other. As curved portions CP of wiring member 86 come in contact with each other, the conduction path becomes shorter when the printed circuit board modules are brought closer to each other.

An effect of power conversion device 100 according to the second modification of the first embodiment will now be described. According to power conversion device 100 in the first embodiment, the center of wiring member 86 is curved like an arch so that wiring member 86 is opposed to joint portions 87. As two curved portions CP provided in wiring member 86 come in contact with each other, the conduction path becomes shorter. Since an electrical resistance of wiring member 86 is thus lowered, heat generation can be reduced. Consequently, power conversion device 100 according to the second modification of the first embodiment can operate at high output.

Figure 12:
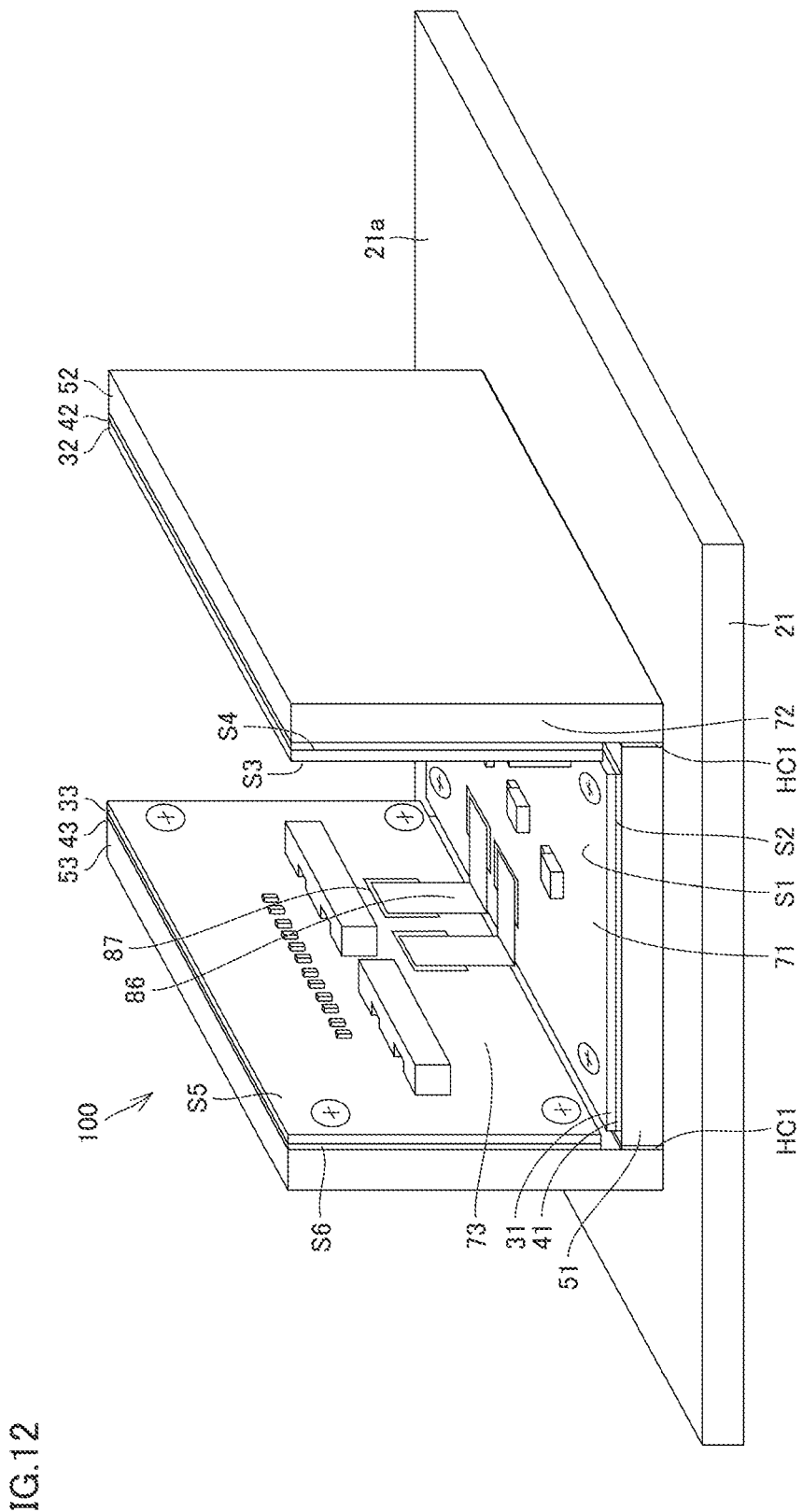
FIG. 12 is a perspective view schematically showing the construction of the power conversion device according to a third modification of the first embodiment.

Power conversion device 100 according to a third modification of the first embodiment will be described with reference to FIG. 12.

Power conversion device 100 according to the third modification of the first embodiment is basically similar in construction to power conversion device 100 according to the first embodiment. Power conversion device 100 according to the third modification of the first embodiment is different from power conversion device 100 according to the first embodiment in arrangement of first cooling body 51, second cooling body 52, and third cooling body 53.

In power conversion device 100 according to the third modification of the first embodiment, first cooling body 51 is arranged as lying between second cooling body 52 and third cooling body 53.

Figure 13:
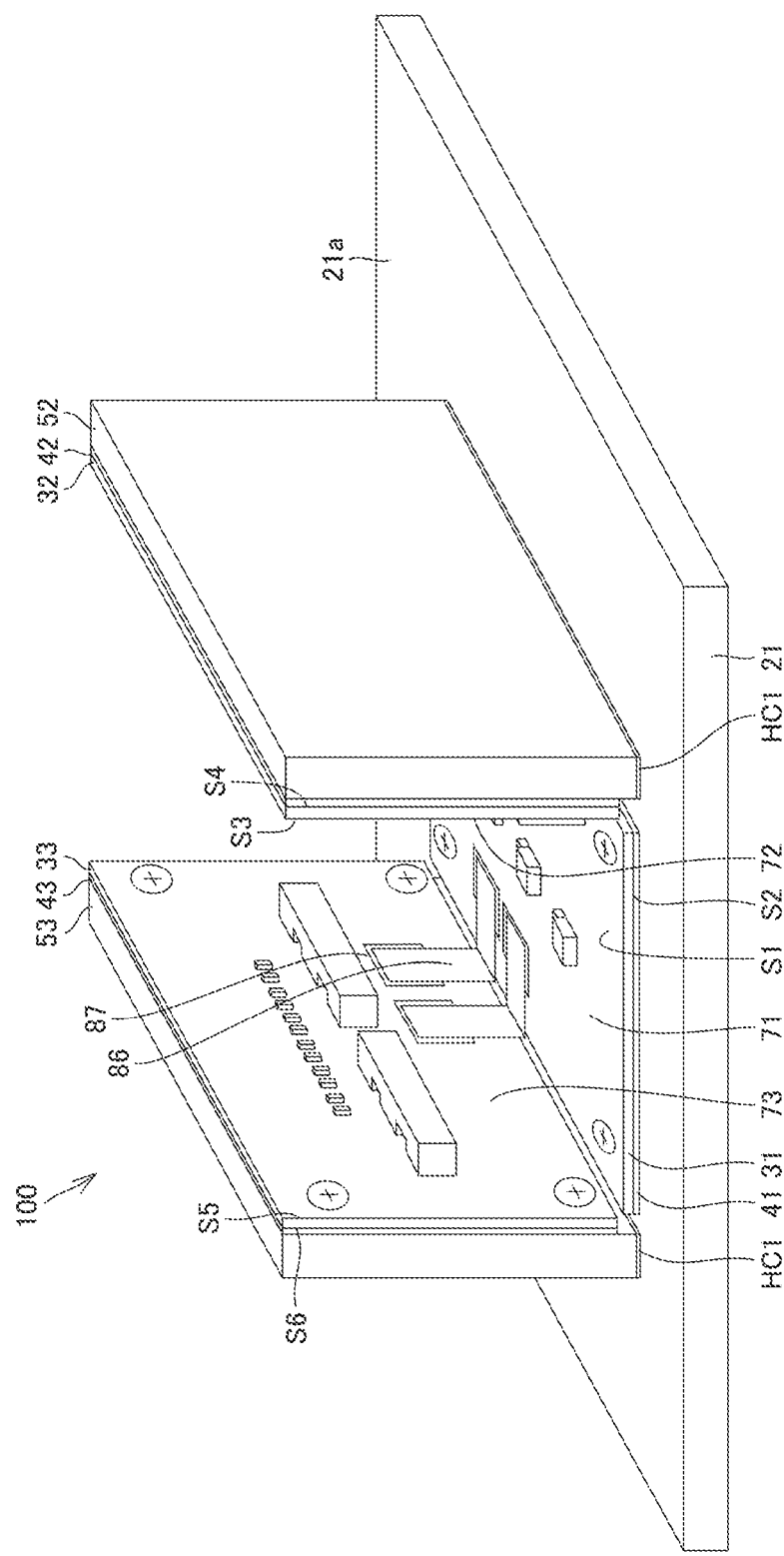
FIG. 13 is a perspective view schematically showing the construction of the power conversion device according to a fourth modification of the first embodiment.

Power conversion device 100 according to a fourth modification of the first embodiment will be described with reference to FIG. 13.

Power conversion device 100 according to the fourth modification of the first embodiment is basically similar in construction to power conversion device 100 according to the first embodiment. Power conversion device 100 according to the fourth modification of the first embodiment is different from power conversion device 100 according to the first embodiment in construction of first cooling body 51 and external cooling body 21.

In power conversion device 100 according to the fourth modification of the first embodiment, first cooling body 51 is formed integrally with external cooling body 21. In this case, first cooling body 51 serves also as external cooling body 21. First cooling body 51 is thermally coupled to external cooling body 21 with such a method as formation integral with external cooling body 21.

Figure 14:
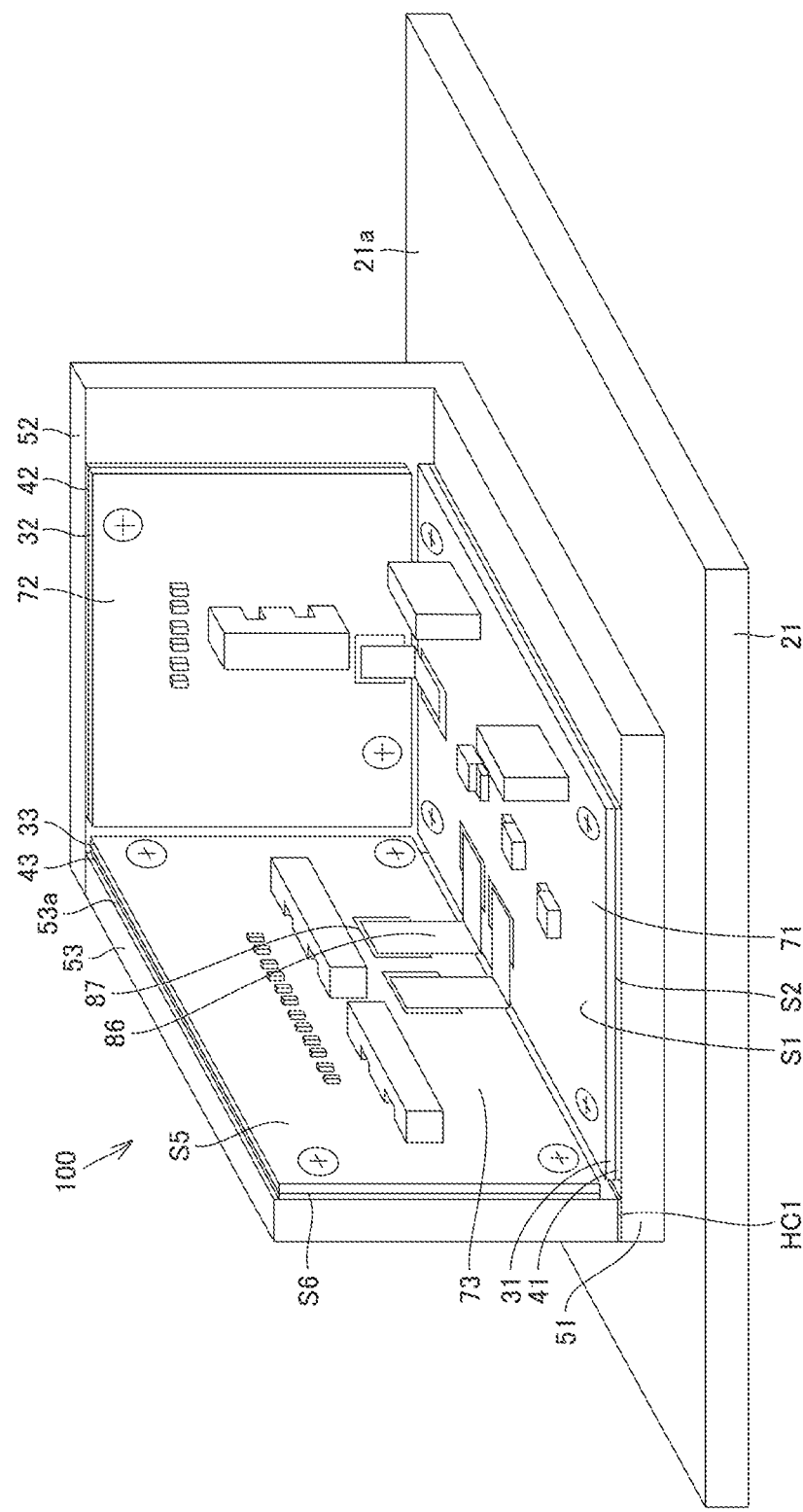
FIG. 14 is a perspective view schematically showing the construction of the power conversion device according to a fifth modification of the first embodiment.

Power conversion device 100 according to a fifth modification of the first embodiment will be described with reference to FIG. 14.

Power conversion device 100 according to the fifth modification of the first embodiment is basically similar in construction to power conversion device 100 according to the first embodiment. Power conversion device 100 according to the fifth modification of the first embodiment is different from power conversion device 100 according to the first embodiment in arrangement of second printed circuit board module 72.

In power conversion device 100 according to the fifth modification of the first embodiment, second printed circuit board module 72 and third printed circuit board module 73 are arranged adjacently to each other. Second printed circuit board 32 and third printed circuit board 33 are arranged adjacently to each other.

According to power conversion device 100 according to the fifth modification of the first embodiment, second printed circuit board 32 and third printed circuit board 33 are arranged adjacently to each other. Therefore, power conversion device 100 can be reduced in size.

Figure 15:
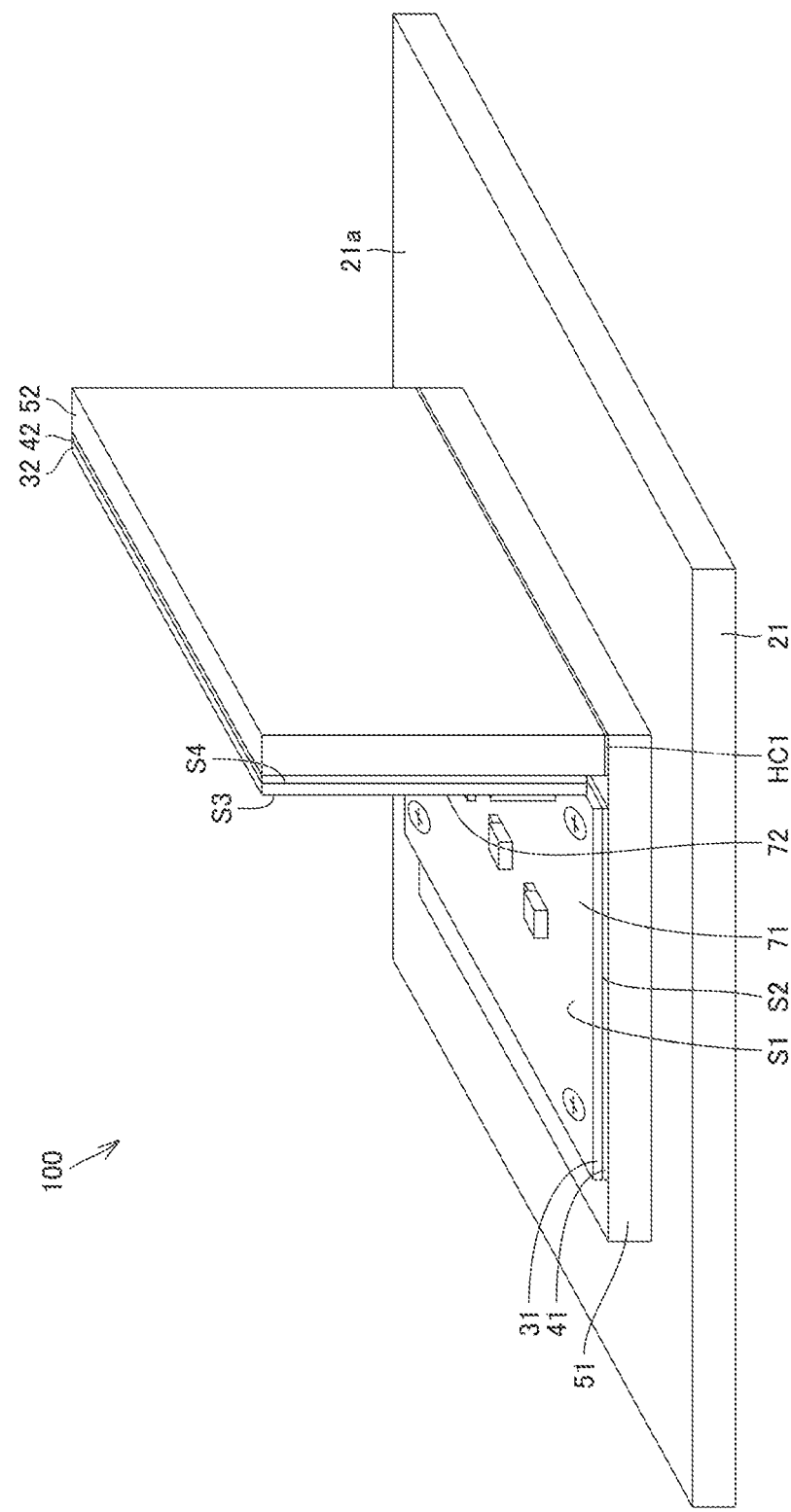
FIG. 15 is a perspective view schematically showing the construction of the power conversion device according to a sixth modification of the first embodiment.

Power conversion device 100 according to a sixth modification of the first embodiment will be described with reference to FIG. 15.

Power conversion device 100 according to the sixth modification of the first embodiment is basically similar in construction to power conversion device 100 according to the first embodiment. Power conversion device 100 according to the sixth modification of the first embodiment is different from power conversion device 100 according to the first embodiment in that third printed circuit board module 73 is not arranged.

Power conversion device 100 according to the sixth modification of the first embodiment does not include third printed circuit board module 73.

Second Embodiment

Figure 16:
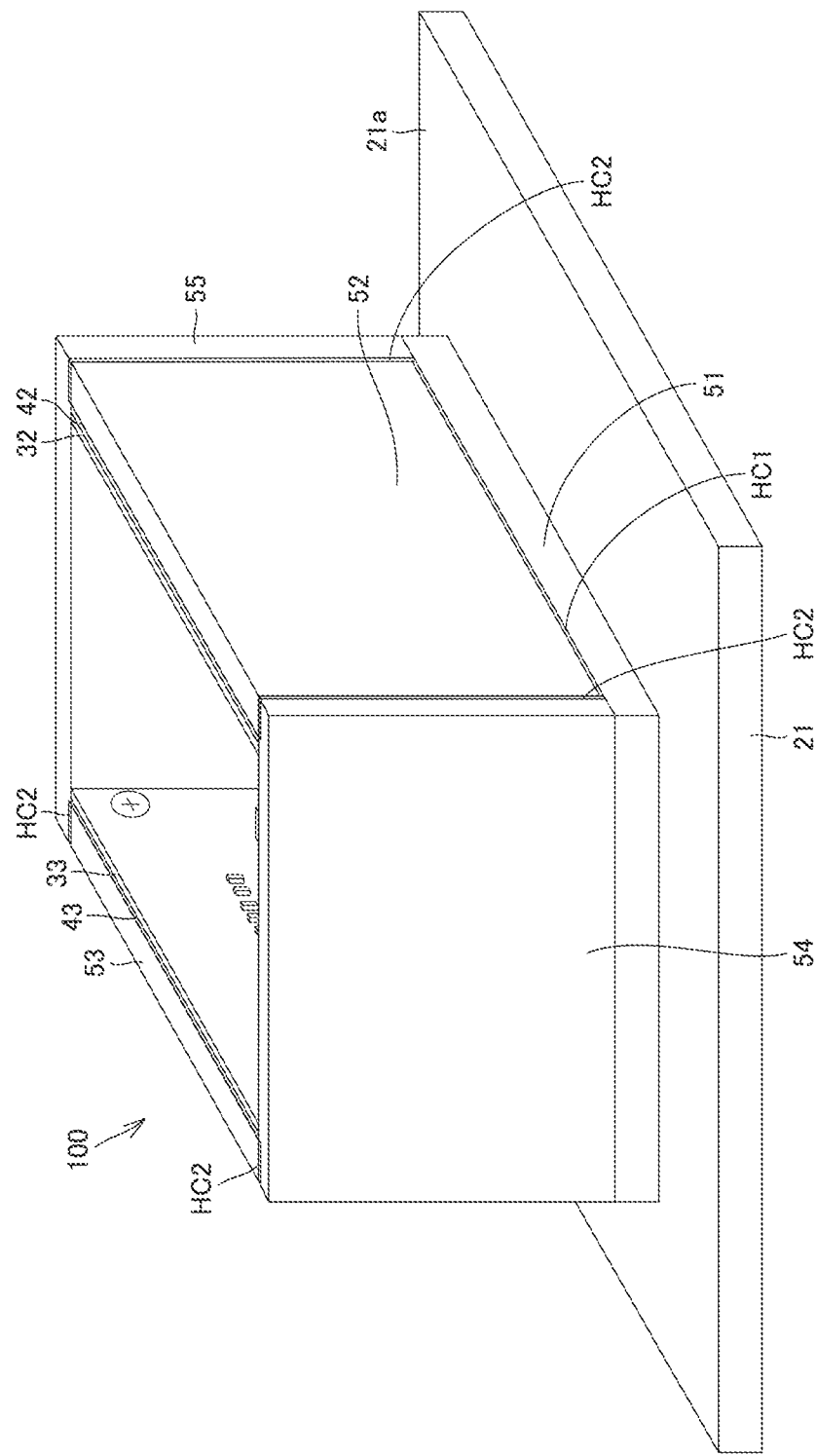
FIG. 16 is a perspective view schematically showing the construction of the power conversion device according to a second embodiment.

Power conversion device 100 according to a second embodiment will now be described with reference to FIG. 16. The second embodiment is identical in construction, operations, and effects to the first embodiment unless particularly described. Therefore, features the same as those in the first embodiment have the same reference characters allotted and description will not be repeated.

Power conversion device 100 according to the second embodiment is basically similar in construction to power conversion device 100 according to the first embodiment. Power conversion device 100 according to the second embodiment is different from power conversion device 100 according to the first embodiment in including a fourth cooling body 54 and a fifth cooling body 55.

Fourth cooling body 54 is constructed to vertically extend with a surface connected to surface S1$a$ of first cooling body 51 being defined as a bottom surface. Fourth cooling body 54 extends in the direction from second main surface S2 of first printed circuit board 31 toward first main surface S1. Fifth cooling body 55 is constructed to vertically extend with a surface connected to surface S1$a$ of first cooling body 51 being defined as a bottom surface. Fifth cooling body 55 extends in the direction from second main surface S2 of first printed circuit board 31 toward first main surface S1.

Each of fourth cooling body 54 and fifth cooling body 55 is connected and fixed to at least one of first cooling body 51, second cooling body 52, and third cooling body 53 directly or with another member being interposed. Each of fourth cooling body 54 and fifth cooling body 55 is thermally connected to each of first cooling body 51, second cooling body 52, and third cooling body 53. Fourth cooling body 54 is thermally connected to first cooling body 51, second cooling body 52, and third cooling body 53. Fifth cooling body 55 is thermally connected to first cooling body 51, second cooling body 52, and third cooling body 53.

At a surface of contact between each of fourth cooling body 54 and fifth cooling body 55 and each of first cooling body 51, second cooling body 52, and third cooling body 53, a thermally conductive member such as the thermally conductive grease, the thermally conductive sheet, or a thermally conductive adhesive (second thermally conductive member) HC2 may be arranged. Thermally conductive member (second thermally conductive member) HC2 includes at least any one of the thermally conductive grease, the thermally conductive sheet, and the thermally conductive adhesive. Fourth cooling body 54 is thermally connected to each of first cooling body 51, second cooling body 52, and third cooling body 53 with thermally conductive member (second thermally conductive member) HC2 being interposed. Fifth cooling body 55 is thermally connected to each of first cooling body 51, second cooling body 52, and third cooling body 53 with thermally conductive member (second thermally conductive member) HC2 being interposed. Each of fourth cooling body 54 and fifth cooling body 55 defines the side surface of the support body of power conversion device 100.

By doing so as well, power conversion device 100 according to the second embodiment can achieve effects equivalent to those of power conversion device 100 according to the first embodiment. Furthermore, as a heat radiation path for radiation of heat generated in the circuit pattern formed at the surface or in the inside of second printed circuit board 32 and heat generated in rectifier elements 5a, 5b, 5c, 5d, 5e, 5f, 5g, and 5h and transformers 3 and 4 which are high-heat-generating components mounted on second printed circuit board 32, two following heat radiation paths are formed in addition to the second heat radiation path for heat radiation to external cooling body 21 through second printed circuit board 32, second insulating member 42, second cooling body 52, and first cooling body 51. The first heat radiation path is a heat radiation path for heat radiation to external cooling body 21 through second printed circuit board 32, second insulating member 42, second cooling body 52, fourth cooling body 54, and first cooling body 51. The second heat radiation path is a heat radiation path for heat radiation to external cooling body 21 through second printed circuit board 32, second insulating member 42, second cooling body 52, fifth cooling body 55, and first cooling body 51. Therefore, performance of power conversion device 100, of radiation of heat generated in the circuit pattern formed at the surface or in the inside of second printed circuit board 32 and heat generated in the high-heat-generating components mounted on second printed circuit board 32 can be enhanced. As a heat radiation path for radiation of heat generated in the circuit pattern formed at the surface or in the inside of third printed circuit board 33 and heat generated in reactors 6 and 7 which are high-heat-generating components mounted on third printed circuit board 33, two following heat radiation paths are formed in addition to the third heat radiation path for heat radiation to external cooling body 21 through third printed circuit board 33, third insulating member 43, third cooling body 53, and first cooling body 51. The first heat radiation path is a heat radiation path for heat radiation to external cooling body 21 through third printed circuit board 33, third insulating member 43, third cooling body 53, fourth cooling body 54, and first cooling body 51. The second heat radiation path is a heat radiation path for heat radiation to external cooling body 21 through third printed circuit board 33, third insulating member 43, third cooling body 53, fifth cooling body 55, and first cooling body 51. Therefore, performance of power conversion device 100, of radiation of heat generated in the circuit pattern formed at the surface or in the inside of third printed circuit board 33 and heat generated in the high-heat-generating components mounted on third printed circuit board 33 can be enhanced. Consequently, power conversion device 100 according to the second embodiment can operate at high output.

In power conversion device 100 according to the second embodiment, fourth cooling body 54 is thermally connected to each of first cooling body 51, second cooling body 52, and third cooling body 53 with thermally conductive member (second thermally conductive member) HC2 being interposed. Fifth cooling body 55 is thermally connected to each of first cooling body 51, second cooling body 52, and third cooling body 53 with thermally conductive member (second thermally conductive member) HC2 being interposed. Therefore, with second thermally conductive member HC2, heat conduction efficiency from fourth cooling body 54 to first cooling body 51, second cooling body 52, and third cooling body 53 can be enhanced and heat conduction efficiency from fifth cooling body 55 to first cooling body 51, second cooling body 52, and third cooling body 53 can be enhanced.

Figure 17:
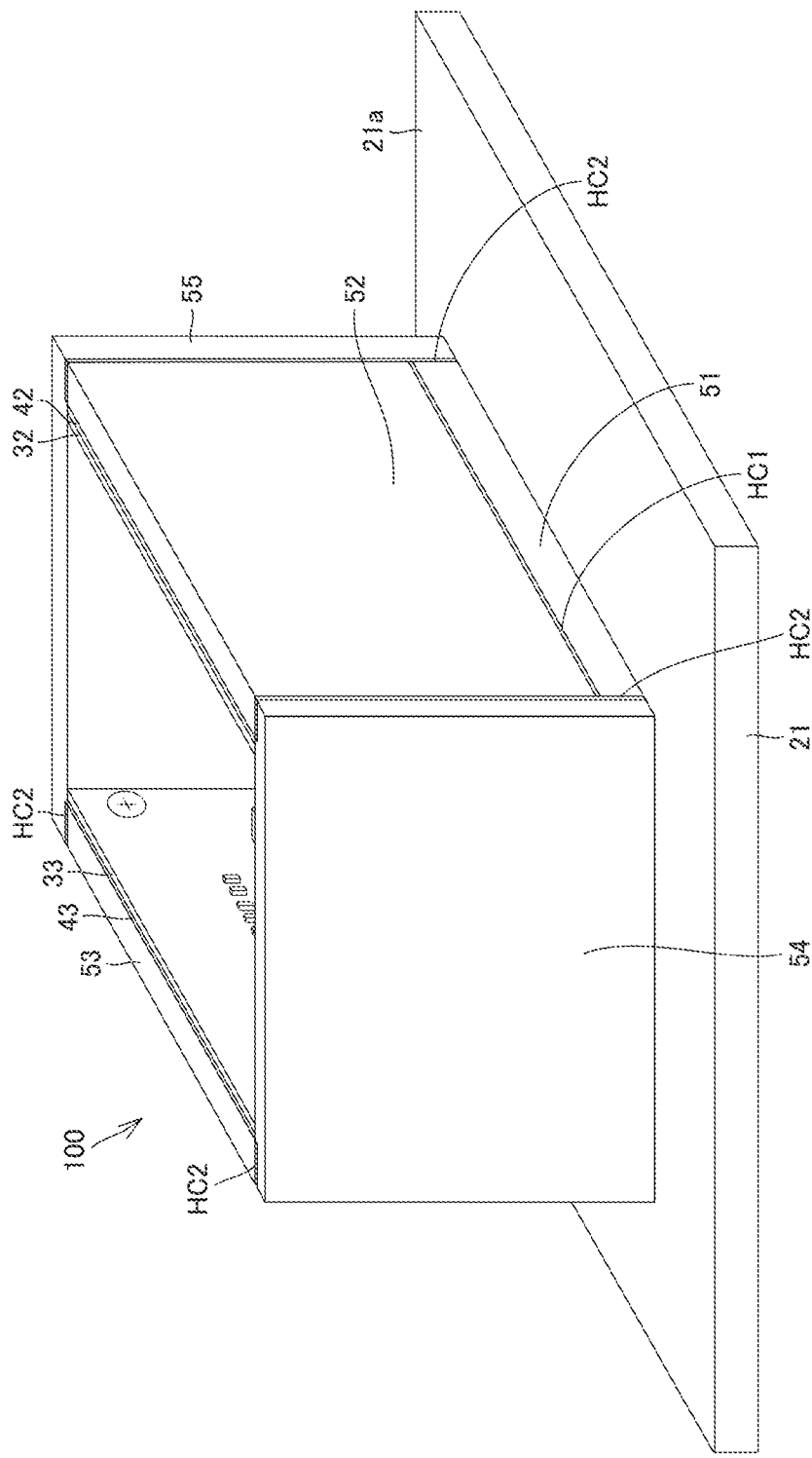
FIG. 17 is a perspective view schematically showing the construction of the power conversion device according to a modification of the second embodiment.

As shown in FIG. 17, power conversion device 100 according to the second embodiment may be constructed such that first cooling body 51 is arranged as lying between fourth cooling body 54 and fifth cooling body 55.

Third Embodiment

Figure 18:
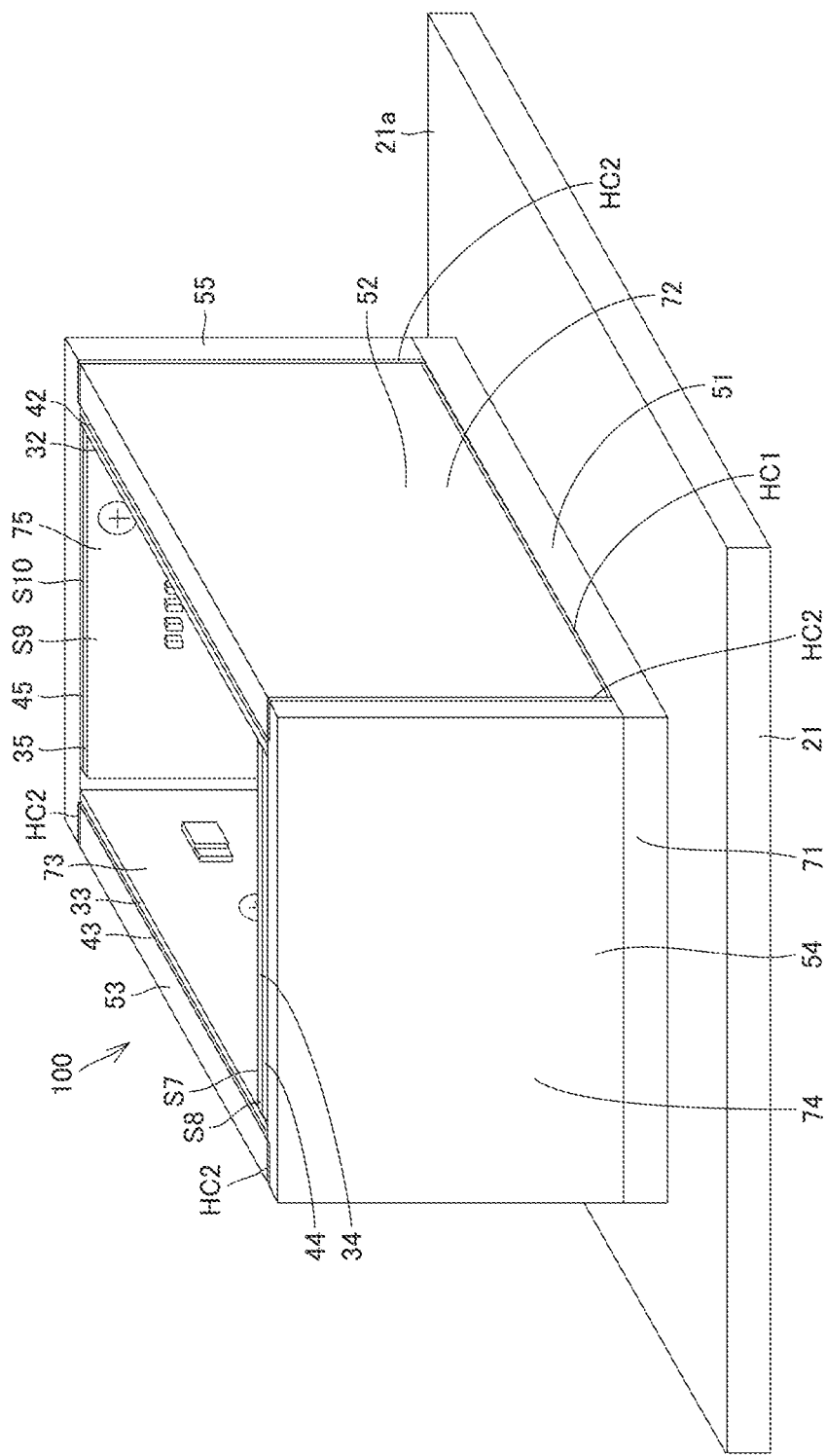
FIG. 18 is a perspective view schematically showing the construction of the power conversion device according to a third embodiment.

Power conversion device 100 according to a third embodiment will now be described with reference to FIGS. 18 and 19. The third embodiment is identical in construction, operations, and effects to the second embodiment unless particularly described. Therefore, features the same as those in the second embodiment have the same reference characters allotted and description will not be repeated.

Power conversion device 100 according to the third embodiment is basically similar in construction to power conversion device 100 according to the second embodiment. Power conversion device 100 according to the third embodiment is different from power conversion device 100 according to the second embodiment in including a fourth printed circuit board module 74 and a fifth printed circuit board module 75.

Fourth printed circuit board module 74 includes a fourth printed circuit board 34, a fourth insulating member 44, fourth cooling body 54, a fourth fixing member 64, an electronic component, and wiring member 86.

Fourth printed circuit board (fourth substrate) 34 includes a front surface (seventh main surface) S7 on which an electronic component (a fourth component) is mounted and a rear surface (an eighth main surface) S8 opposed to fourth cooling body 54. Seventh main surface S7 is opposed to eighth main surface S8. Fourth insulating member 44 is arranged between eighth main surface S8 of fourth printed circuit board 34 and fourth cooling body 54. Fourth cooling body 54 is thermally connected to eighth main surface S8 of fourth printed circuit board 34. Fourth cooling body 54 is thermally connected to eighth main surface S8 of fourth printed circuit board 34 with fourth insulating member 44 being interposed. Fourth cooling body 54 is constructed to vertically extend with a surface connected to surface S1a of first cooling body 51 opposed to first printed circuit board 31 being defined as a bottom surface. Fourth cooling body 54 extends in the direction from second main surface S2 of first printed circuit board 31 toward first main surface S1. Fourth cooling body 54 is thermally connected to each of first cooling body 51, second cooling body 52, and third cooling body 53. Fourth fixing member 64 is constructed to fix fourth printed circuit board 34 to fourth cooling body 54.

Fifth printed circuit board module 75 includes a fifth printed circuit board 35, a fifth insulating member 45, fifth cooling body 55, a fifth fixing member 65, and an electronic component.

Fifth printed circuit board (fifth substrate) 35 includes a front surface (a ninth main surface) S9 on which an electronic component (a fifth component) is mounted and a rear surface (a tenth main surface) S10 opposed to fifth cooling body 55. Ninth main surface S9 is opposed to tenth main surface S10. Fifth insulating member 45 is arranged between tenth main surface S10 of fifth printed circuit board 35 and fifth cooling body 55. Fifth cooling body 55 is thermally connected to tenth main surface S10 of fifth printed circuit board 35. Fifth cooling body 55 is thermally connected to tenth main surface S10 of fifth printed circuit board 35 with fifth insulating member 45 being interposed. Fifth cooling body 55 is constructed to vertically extend with a surface connected to surface S1a of first cooling body 51 opposed to first printed circuit board 31 being defined as a bottom surface. Fifth cooling body 55 extends in the direction from second main surface S2 of first printed circuit board 31 toward first main surface S1. Fifth cooling body 55 is thermally connected to each of first cooling body 51, second cooling body 52, and third cooling body 53. Fifth fixing member 65 is constructed to fix fifth printed circuit board 35 to fifth cooling body 55.

Joint portion 87 is provided in each of fourth printed circuit board 34 and fifth printed circuit board 35. First printed circuit board 31 and fourth printed circuit board 34 are electrically connected to each other and first printed circuit board 31 and fifth printed circuit board 35 are electrically connected to each other, through wiring member 86 at joint portions 87.

Fourth printed circuit board module 74 and fifth printed circuit board module 75 are made also through the preparation step, the assembly step, and the connection step as in the first embodiment.

Figure 19:
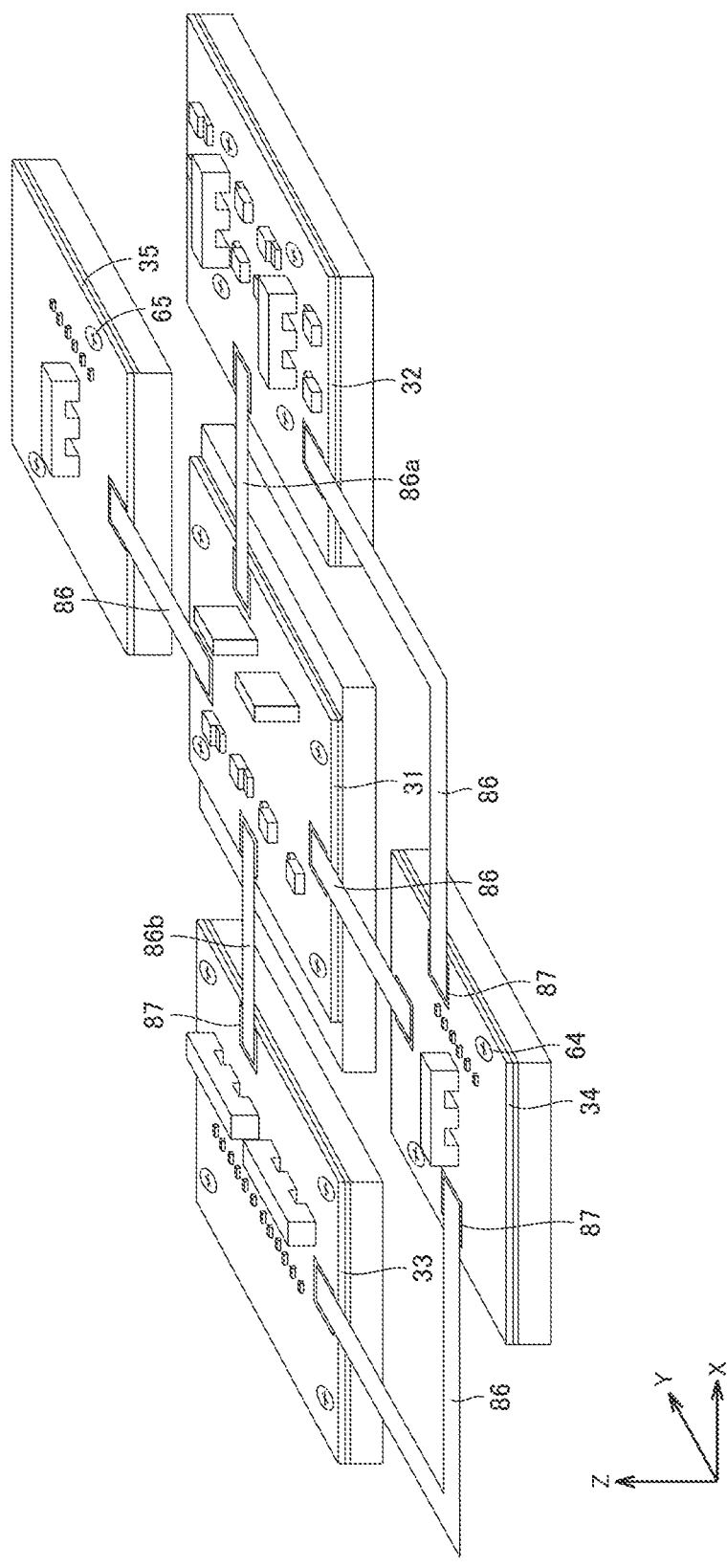
FIG. 19 is a perspective view for illustrating electrical connection among the printed circuit board modules of the power conversion device according to the third embodiment.

In power conversion device 100 in the third embodiment, as shown in FIG. 19, joint portion 87 is provided in each of second printed circuit board 32 and fourth printed circuit board 34 and in each of third printed circuit board 33 and fourth printed circuit board 34. Second printed circuit board 32 and fourth printed circuit board 34 are electrically connected to each other and third printed circuit board 33 and fourth printed circuit board 34 are electrically connected to each other, through wiring member 86 at joint portions 87. Similarly, second printed circuit board 32 and fifth printed circuit board 35 may electrically be connected to each other and third printed circuit board 33 and fifth printed circuit board 35 may electrically be connected to each other, through wiring member 86 at joint portions 87. Though wiring member 86 that connects second printed circuit board 32 and fourth printed circuit board 34 to each other and wiring member 86 that connects third printed circuit board 33 and fourth printed circuit board 34 to each other are each in an L shape in FIG. 19, the shape is not limited thereto. Wiring member 86 should only be in a shape that allows mitigation of position displacement in the direction of the Z axis of second printed circuit board 32 and fourth printed circuit board 34 when second printed circuit board 32 and fourth printed circuit board 34 are erected with respect to first printed circuit board 31 in the direction of the Z axis. In addition, wiring member 86 should only be in a shape that allows mitigation of position displacement in the direction of the Z axis of third printed circuit board 33 and fourth printed circuit board 34 when third printed circuit board 33 and fourth printed circuit board 34 are erected with respect to first printed circuit board 31 in the direction of the Z axis.

Figure 20:
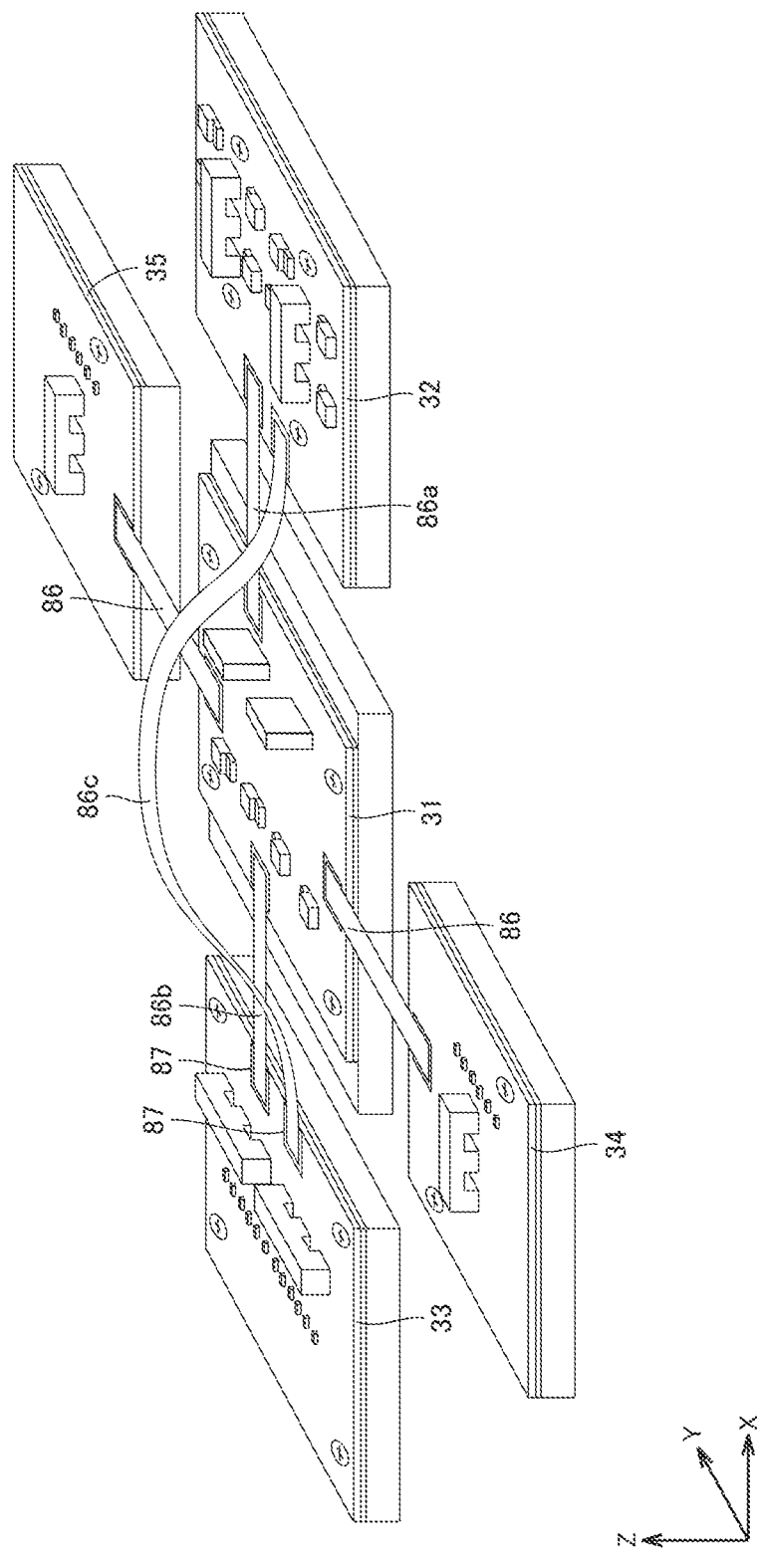
FIG. 20 is a perspective view for illustrating electrical connection among the printed circuit board modules of the power conversion device according to a modification of the third embodiment.

In power conversion device 100 according to the third embodiment, as shown in FIG. 20, second printed circuit board 32 and third printed circuit board 33 may electrically be connected to each other. In this case, wiring member 86 includes a third wiring member 86c. Third wiring member 86c electrically connects second printed circuit board 32 and third printed circuit board 33 to each other. Third wiring member 86c is connected to third main surface S3 of second printed circuit board 32 and fifth main surface S5 of third printed circuit board 33 by any of direct connection and solder joint.

An Effect of Power Conversion Device 100 According to the Third Embodiment Will Now be Described.

According to power conversion device 100 according to the third embodiment, in conduction from second printed circuit board 32 to fourth printed circuit board 34, direct conduction without passing through first printed circuit board 31 can be achieved. Therefore, the conduction path from second printed circuit board 32 to fourth printed circuit board 34 can be shortest and a conduction pattern in the first printed circuit board can be omitted. Since an electrical resistance of the conduction pattern is thus lowered, heat generation can be reduced. Since first printed circuit board 31 can also be smaller in area, it can be reduced in size. Consequently, power conversion device 100 according to the third embodiment can operate at high output.

In addition, in conduction from third printed circuit board 33 to fourth printed circuit board 34, direct conduction without passing through first printed circuit board 31 can be achieved. Therefore, the conduction path from third printed circuit board 33 to fourth printed circuit board 34 can be shortest and a conduction pattern in the first printed circuit board can be omitted. Since an electrical resistance of the conduction pattern is thus lowered, heat generation can be reduced. Since first printed circuit board 31 can also be smaller in area, it can be reduced in size. Consequently, power conversion device 100 according to the third embodiment can operate at high output.

Power conversion device 100 according to the third embodiment can achieve effects equivalent to those of power conversion device 100 according to the second embodiment. Furthermore, in power conversion device 100 according to the third embodiment, a fourth heat radiation path for heat radiation to external cooling body 21 through fourth printed circuit board 34, fourth insulating member 44, fourth cooling body 54, and first cooling body 51 can be formed as the heat radiation path for radiation of heat generated in the circuit pattern formed at the surface or in the inside of fourth printed circuit board 34 and heat generated in smoothing capacitor 8 and reactor 6 which are high-heat-generating components mounted on fourth printed circuit board 34. Since the fourth heat radiation path does not include the plate-like substrate mounting member as compared with the construction described in PTL 1, the heat radiation path can be shorter in length and heat radiation performance can be enhanced. Therefore, performance of power conversion device 100, of radiation of heat generated in the circuit pattern formed at the surface or in the inside of fourth printed circuit board 34 and heat generated in the high-heat-generating components mounted on fourth printed circuit board 34 can be enhanced. Consequently, power conversion device 100 according to the third embodiment can operate at high output.

When fourth insulating member 44 is in surface contact with fourth printed circuit board 34 and fourth cooling body 54, an area of the surface of contact between fourth insulating member 44 and fourth printed circuit board 34 and an area of the surface of contact between fourth insulating member 44 and fourth cooling body 54 can be increased. Therefore, since the contact thermal resistance of the surface of contact between fourth insulating member 44 and fourth printed circuit board 34 and the contact thermal resistance of the surface of contact between fourth insulating member 44 and fourth cooling body 54 can be lowered, heat radiation performance of the fourth heat radiation path can be enhanced. Consequently, power conversion device 100 according to the third embodiment can operate at high output.

A fifth heat radiation path for heat radiation to external cooling body 21 through fifth printed circuit board 35, fifth insulating member 45, fifth cooling body 55, and first cooling body 51 can be formed as the heat radiation path for radiation of heat generated in the circuit pattern formed at the surface or in the inside of fifth printed circuit board 35 and heat generated in smoothing capacitor 8 and reactor 7 which are high-heat-generating components mounted on fifth printed circuit board 35. Since the fifth heat radiation path does not include the plate-like substrate mounting member as compared with the construction described in PTL 1, the heat radiation path can be shorter in length and heat radiation performance can be enhanced. Therefore, performance of power conversion device 100, of radiation of heat generated in the circuit pattern formed at the surface or in the inside of fifth printed circuit board 35 and heat generated in the high-heat-generating components mounted on fifth printed circuit board 35 can be enhanced. Consequently, power conversion device 100 according to the third embodiment can operate at high output.

When fifth insulating member 45 is in surface contact with fifth printed circuit board 35 and fifth cooling body 55, an area of the surface of contact between fifth insulating member 45 and fifth printed circuit board 35 and an area of the surface of contact between fifth insulating member 45 and fifth cooling body 55 can be increased. Therefore, since the contact thermal resistance of the surface of contact between fifth insulating member 45 and fifth printed circuit board 35 and the contact thermal resistance of the surface of contact between fifth insulating member 45 and fifth cooling body 55 can be lowered, heat radiation performance of the fifth heat radiation path can be enhanced. Consequently, power conversion device 100 according to the third embodiment can operate at high output.

A thickness of fourth cooling body 54 in a direction substantially perpendicular to a surface 34a of fourth printed circuit board 34 is preferably large. Since a thermal resistance of fourth cooling body 54 included in the fourth heat radiation path can thus be lowered, heat radiation performance can be enhanced.

A thickness of fifth cooling body 55 in a direction substantially perpendicular to a surface 35a of fifth printed circuit board 35 is preferably large. Since a thermal resistance of fifth cooling body 55 included in the fifth heat radiation path can thus be lowered, heat radiation performance can be enhanced.

High-heat-generating components can be mounted not only on first printed circuit board 31, second printed circuit board 32, and third printed circuit board 33 but also on each of fourth printed circuit board 34 and fifth printed circuit board 35. Therefore, since a distance between high-heat-generating components mounted on the printed circuit boards can be longer, thermal interference of heat generated in the high-heat-generating components can be suppressed, and performance of power conversion device 100, of radiation of heat generated in each high-heat-generating component can be enhanced. Consequently, power conversion device 100 according to the third embodiment can operate at high output.

Electronic components can be mounted not only on first printed circuit board 31, second printed circuit board 32, and third printed circuit board 33 but also on each of fourth printed circuit board 34 and fifth printed circuit board 35. Therefore, since a component mount area increases, first printed circuit board 31, second printed circuit board 32, and third printed circuit board 33 can be smaller in size than in the first and second embodiments. Consequently, power conversion device 100 according to the third embodiment can be reduced in size.

Power conversion device 100 according to the third embodiment does not have to include fifth printed circuit board 35, fifth insulating member 45, and fifth fixing member 65. In other words, power conversion device 100 may include external cooling body 21, first printed circuit board module 71, the second printed circuit board module, third printed circuit board module 73, and fourth printed circuit board module 74, and fifth cooling body 55. First printed circuit board module 71, second printed circuit board module 72, third printed circuit board module 73, and fourth printed circuit board module 74 are electrically connected to one another through wiring member 86 at joint portions 87.

Though electronic components arranged in first printed circuit board module 71, second printed circuit board module 72, third printed circuit board module 73, fourth printed circuit board module 74, and fifth printed circuit board module 75 may be interchanged, particularly high-heat-generating components are arranged preferably in first printed circuit board module 71.

According to power conversion device 100 according to the third embodiment, third wiring member 86c is connected to third main surface S3 of second printed circuit board 32 and fifth main surface S5 of third printed circuit board 33 by any of direct connection and solder joint. Power conversion device 100 can thus be reduced in size.

Fourth Embodiment

Figure 21:
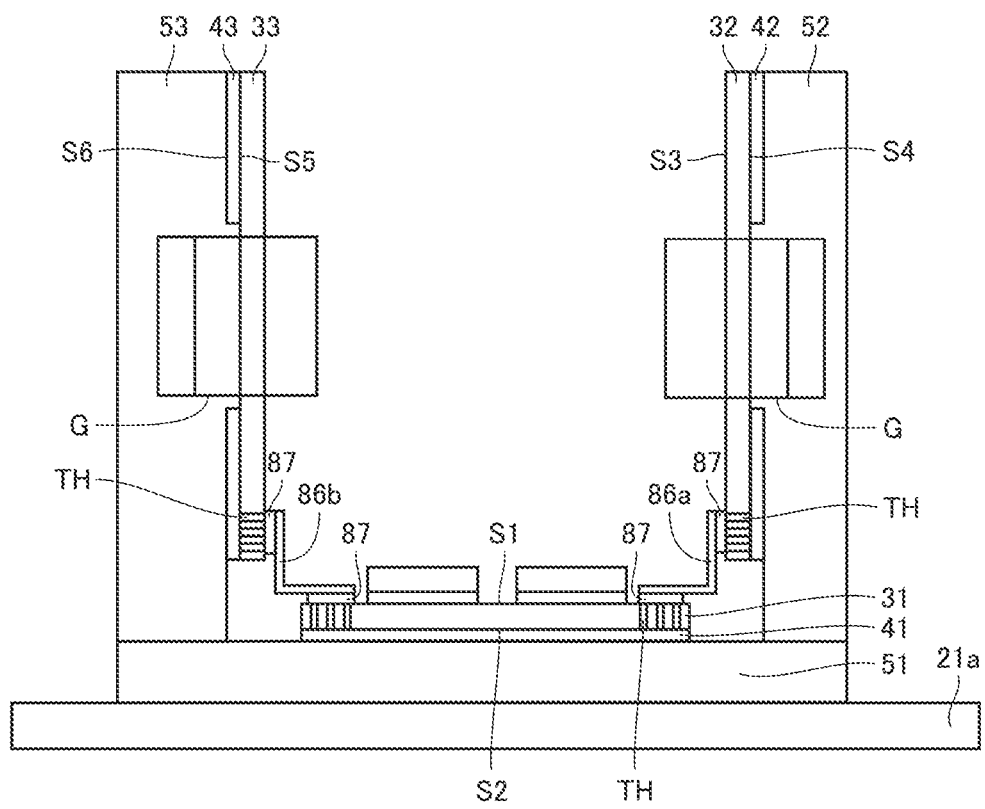
FIG. 21 is a cross-sectional view schematically showing the construction of the power conversion device according to a fourth embodiment.

Power conversion device 100 according to a fourth embodiment will now be described with reference to FIG. 21. The fourth embodiment is identical in construction, operations, and effects to the first embodiment unless particularly described. Therefore, features the same as those in the first embodiment have the same reference characters allotted and description will not be repeated. FIG. 21 is a cross-sectional view showing a state after first cooling body 51, second cooling body 52, and third cooling body 53 are assembled as in FIG. 2. For the sake of convenience of description, hatching is not provided in FIG. 21.

As shown in FIG. 21, in power conversion device 100 according to the fourth embodiment, a through hole TH that passes through first main surface S1 and second main surface S2 is provided in first printed circuit board 31. A through hole TH that passes through third main surface S3 and fourth main surface S4 is provided in second printed circuit board 32. A through hole TH that passes through fifth main surface S5 and sixth main surface S6 is provided in third printed circuit board 33.

In through hole TH, for example, copper plating of a thickness of several ten micrometers is provided on an inner wall of a hole made in the printed circuit board. A material for through hole TH is similar to that of a not-shown circuit pattern. The material for through hole TH may be identical to or different from that of the not-shown circuit pattern.

Through hole TH may be set to a potential as high as wiring member 86 through joint portion 87. Through hole TH is isolated from first cooling body 51, second cooling body 52, and third cooling body 53 by first insulating member 41, second insulating member 42, and third insulating member 43.

Through hole TH should only be arranged at least directly under joint portion (first joint portion) 87. Furthermore, arrangement of through hole TH not only directly under joint portion 87 but also around joint portion 87 would enhance heat radiation performance.

Heat generated in wiring member 86 is mainly radiated through joint portion 87, the printed circuit board, the insulating member, and the cooling body. Since a thermal resistance of the printed circuit board is highest in a heat radiation path in wiring member 86, the thermal resistance of the printed circuit board should be lowered.

According to power conversion device 100 according to the fourth embodiment, through hole TH serves to increase a thermal conductivity in a direction of thickness of the printed circuit board directly under joint portion 87. The thermal resistance in the direction of thickness of the printed circuit board is thus lowered. Therefore, performance of radiation of heat generated in wiring member 86 can be enhanced.

Fifth Embodiment

Figure 22:
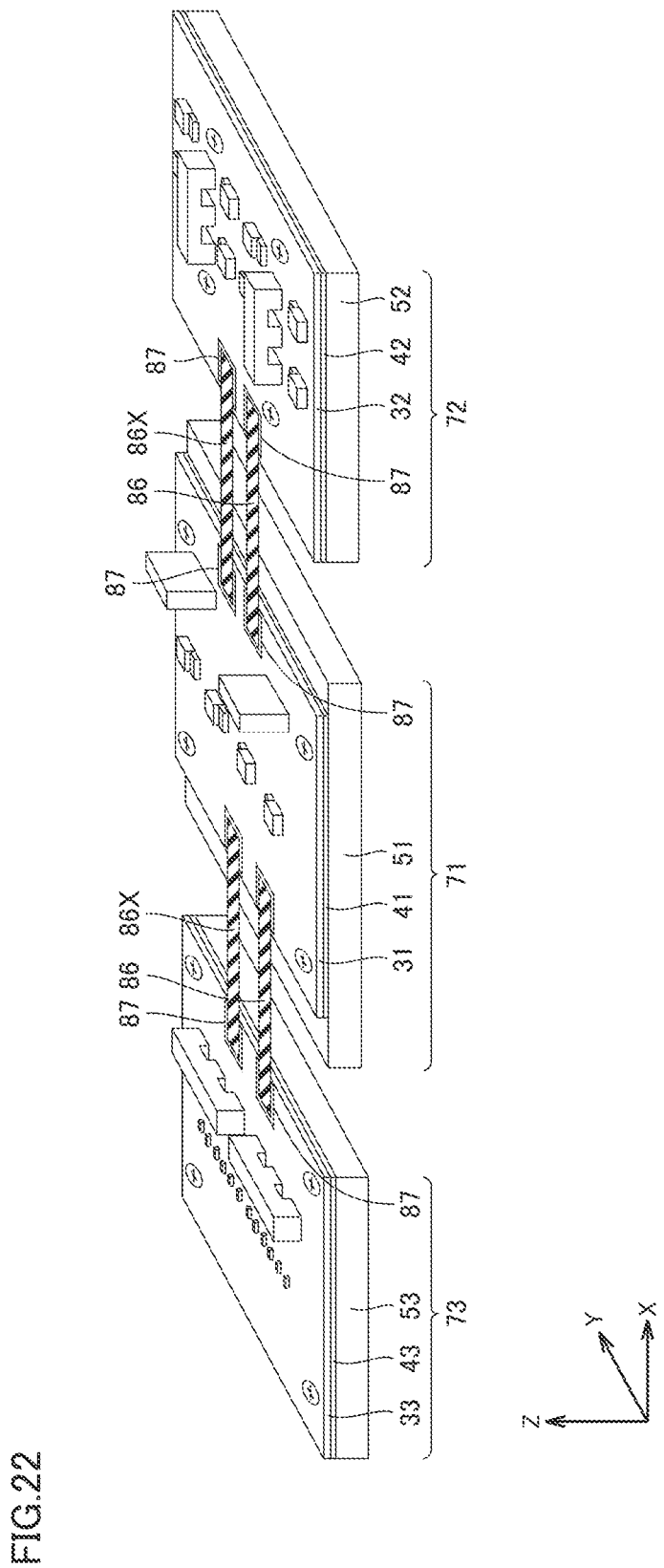
FIG. 22 is a perspective view for illustrating electrical connection between the printed circuit board modules of the power conversion device according to a fifth embodiment.

Power conversion device 100 according to a fifth embodiment will now be described with reference to FIG. 22. The fifth embodiment is identical in construction, operations, and effects to the first embodiment unless particularly described. Therefore, features the same as those in the first embodiment have the same reference characters allotted and description will not be repeated. FIG. 22 is a developed view of first printed circuit board module 71, second printed circuit board module 72, and third printed circuit board module 73 of power conversion device 100.

As shown in FIG. 22, in power conversion device 100 according to the fifth embodiment, a surface of wiring member 86 is covered with an insulating coating 86X. Insulating coating 86X is composed, for example, of vinyl chloride, fluoroplastic, or polyimide.

When second printed circuit board module 72 and third printed circuit board module 73 are erected with respect to first printed circuit board module 71, curved wiring member 86 may come in contact with an unintended portion such as an electronic component, a cooling body, or a circuit pattern therearound, and short-circuiting may occur.

Since wiring member 86 is in contact with air, there is a path for heat radiation by direct emission from wiring member 86 to air other than the heat radiation path to the cooling body through the printed circuit board. Since wiring member 86 is composed of a metal, emissivity at the surface of wiring member 86 is low. Therefore, performance of emission to air is low.

According to power conversion device 100 according to the fifth embodiment, even when wiring member 86 comes in contact with an electronic component therearound when wiring member 86 is curved, insulating coating 86X can prevent occurrence of short-circuiting. Since insulating coating 86X can improve emissivity at the surface of wiring member 86, performance of heat radiation to air can be enhanced.

Sixth Embodiment

Figure 23:
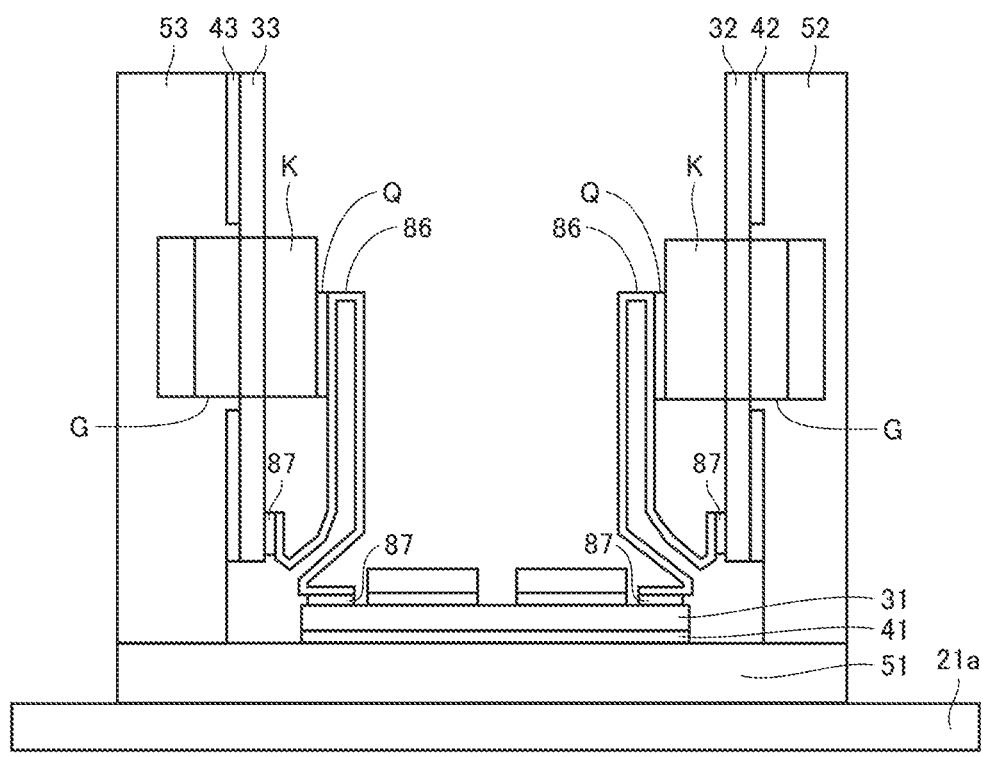
FIG. 23 is a cross-sectional view schematically showing the construction of the power conversion device according to a sixth embodiment.

Power conversion device 100 according to a sixth embodiment will now be described with reference to FIG. 23. The sixth embodiment is identical in construction, operations, and effects to the first embodiment unless particularly described. Therefore, features the same as those in the first embodiment have the same reference characters allotted and description will not be repeated. FIG. 23 is a cross-sectional view showing a state after first cooling body 51, second cooling body 52, and third cooling body 53 are assembled as in FIG. 2. For the sake of convenience of description, hatching is not provided in FIG. 23.

As shown in FIG. 23, power conversion device 100 according to the sixth embodiment is different from power conversion device 100 according to the first embodiment in shape of wiring member 86.

While first cooling body 51, second cooling body 52, and third cooling body 53 are assembled, wiring member 86 in a flexed state is in contact with a core K with a heat radiation member Q being interposed. Core K is a member that implements transformers 3 and 4 or reactors 6 and 7. Heat generated in wiring member 86 conducts to heat radiation member Q, core K, second cooling body 52, and third cooling body 53 and radiated. Heat radiation member Q is composed of an electrically insulating and highly thermally conductive material.

In the present embodiment, an electrically insulating adhesive is employed as heat radiation member Q. A sheet or grease in which particles of highly thermally conductive and electrically insulating aluminum oxide or aluminum nitride are mixed in a silicone resin may be employed as heat radiation member Q.

Wiring member 86 may have a long length at the time of manufacturing of power conversion device 100. At this time, an electrical resistance value of wiring member 86 increases and the heat radiation path in wiring member 86 becomes long, and hence a temperature of wiring member 86 increases.

According to power conversion device 100 according to the sixth embodiment, wiring member 86 in a flexed state comes in contact with core K with heat radiation member Q being interposed. A central portion of wiring member 86 in contact with core K allows heat radiation from core K to the cooling body other than a heat radiation path to the cooling body through joint portion 87 and a heat radiation path to air. Therefore, heat radiation performance can further be enhanced.

Power conversion device 100 according to a modification of the sixth embodiment will now be described. The modification of the sixth embodiment is identical in construction, operations, and effects to the sixth embodiment unless particularly described. Therefore, features the same as those in the sixth embodiment have the same reference characters allotted and description will not be repeated.

Figure 24:
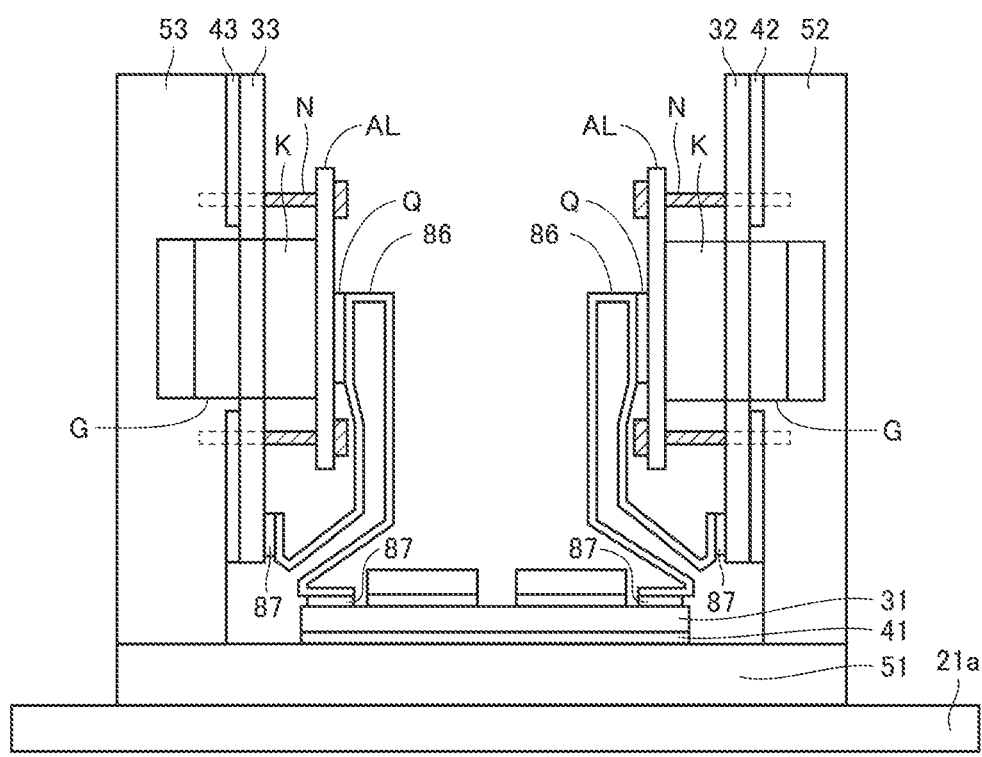
FIG. 24 is a cross-sectional view schematically showing the construction of the power conversion device according to a first modification of the sixth embodiment.

Power conversion device 100 according to a first modification of the sixth embodiment will be described with reference to FIG. 24. For the sake of convenience of description, hatching is not provided in FIG. 24.

Wiring member 86 may radiate heat by coming in contact with a structure other than core K. As shown in FIG. 24, wiring member 86 may radiate heat by coming in contact with a sheet metal AL that fixes core K. In the present embodiment, core K is fixed by a screw N and sheet metal AL. A hole through which screw N passes is provided in each of second printed circuit board 32 and third printed circuit board 33. Screw N is fixed to each of second cooling body 52 and third cooling body 53 through this hole.

So long as an object in contact with wiring member 86 is insulated, wiring member 86 may be in contact with any object such as first cooling body 51, second cooling body 52, third cooling body 53, first printed circuit board 31, or a circuit pattern (not shown) of the printed circuit board.

According to power conversion device 100 according to the first modification of the sixth embodiment, performance of radiation of heat generated in wiring member 86 can be enhanced.

Power conversion device 100 according to a second modification of the sixth embodiment will be described with reference to FIG. 25. For the sake of convenience of description, hatching is not provided in FIG. 25.

Figure 25:
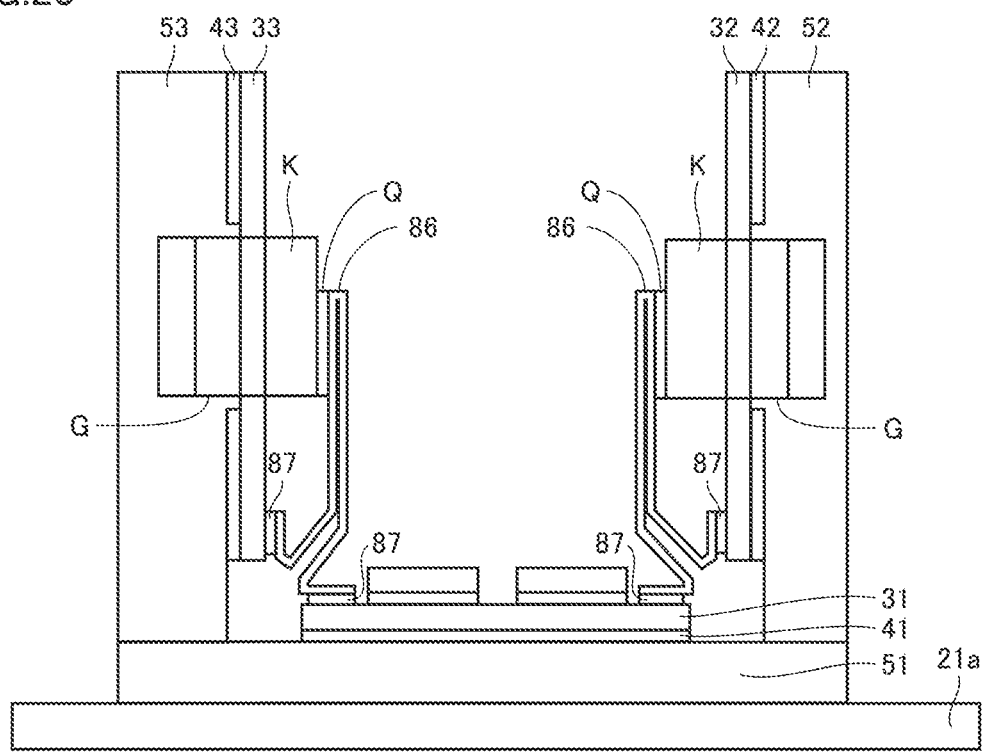
FIG. 25 is a cross-sectional view schematically showing the construction of the power conversion device according to a second modification of the sixth embodiment.

As shown in FIG. 25, parts of wiring member 86 may come in contact with each other and a conduction path may become shorter.

According to power conversion device 100 according to the second modification of the sixth embodiment, the conduction path in wiring member 86 is shorter. Since the electrical resistance of wiring member 86 is thus further lowered, heat generation can be reduced.

The embodiments above can be combined as appropriate.

It should be understood that the embodiments disclosed herein are illustrative and non-restrictive in every respect. The scope of the present disclosure is defined by the terms of the claims rather than the description above and is intended to include any modifications within the scope and meaning equivalent to the terms of the claims.

REFERENCE SIGNS LIST

21 external cooling body; 31 first printed circuit board; 32 second printed circuit board; 33 third printed circuit board; 34 fourth printed circuit board; 35 fifth printed circuit board; 41 to 45 first insulating member to fifth insulating member; 51 to 55 first cooling body to fifth cooling body; 61 to 65 first fixing member to fifth fixing member; 71 to 75 first printed circuit board module to fifth printed circuit board module; 86 wiring member; 86a first wiring member; 86b second wiring member; 86c third wiring member; 87 joint portion; 100 power conversion device; BP bent portion; CP curved portion; HC1 first thermally conductive member; HC2 second thermally conductive member; S1 to S10 first main surface to tenth main surface; S100 preparation step; S200 assembly step; S300 connection step.

The invention claimed is:

1. A power conversion device comprising:
an electronic component including a first component and a second component;
a first substrate including a first main surface on which the first component of the electronic component is mounted and a second main surface opposed to the first main surface;
a first cooling body thermally connected to the second main surface of the first substrate;
a second substrate including a third main surface on which the second component of the electronic component is mounted and a fourth main surface opposed to the third main surface;
a second cooling body thermally connected to the fourth main surface of the second substrate; and
a wiring member, wherein
the second cooling body extends in a direction from the second main surface of the first substrate toward the first main surface,
the wiring member includes a first wiring member to electrically connect the first substrate and the second substrate to each other,
the power conversion device further comprises a first insulating member arranged between the second main surface of the first substrate and the first cooling body,
on the first main surface of the first substrate, a first joint portion to which the first wiring member is joined is provided,
between the second main surface of the first substrate and the first cooling body, the first insulating member is arranged on a rear surface of at least the first joint portion;
the first substrate is provided on an inner side of the first cooling body, and
the second substrate is provided on an inner side of the second cooling body.

2. The power conversion device according to claim 1, further comprising a second insulating member arranged between the fourth main surface of the second substrate and the second cooling body, wherein
on the third main surface of the second substrate, a second joint portion to which the first wiring member is joined is provided, and
between the fourth main surface of the second substrate and the second cooling body, the second insulating member is arranged on a rear surface of at least the second joint portion.

3. The power conversion device according to claim 2, wherein
the electronic component includes a third component,
the power conversion device further comprises:
a third substrate including a fifth main surface on which the third component of the electronic component is mounted and a sixth main surface opposed to the fifth main surface;
a third cooling body thermally connected to the sixth main surface of the third substrate; and
a third insulating member arranged between the sixth main surface of the third substrate and the third cooling body,
the wiring member includes a second wiring member to electrically connect the first substrate and the third substrate to each other,
the third cooling body extends in the direction from the second main surface of the first substrate toward the first main surface,
on the fifth main surface of the third substrate, a third joint portion to which the second wiring member is joined is provided, and
between the sixth main surface of the third substrate and the third cooling body, the third insulating member is arranged on a rear surface of at least the third joint portion.

4. The power conversion device according to claim 3, wherein
the wiring member includes a third wiring member to electrically connect the second substrate and the third substrate to each other,
on the third main surface of the second substrate, a fourth joint portion to which the third wiring member is joined is provided, on the fifth main surface of the third substrate, a fifth joint portion to which the third wiring member is joined is provided, between the third main surface of the second substrate and the second cooling body, the second insulating member is arranged on a rear surface of at least the fourth joint portion, and between the sixth main surface of the third substrate and the third cooling body, the third insulating member is arranged on a rear surface of at least the fifth joint portion.

5. The power conversion device according to claim 3, wherein
each of the second substrate and the third substrate extends in the direction from the second main surface of the first substrate toward the first main surface, and
the second substrate and the third substrate are arranged adjacently to each other.

6. The power conversion device according to claim 3, wherein
each of the second substrate and the third substrate extends in the direction from the second main surface of the first substrate toward the first main surface, and
the second substrate and the third substrate are arranged to face each other.

7. The power conversion device according to claim 3, wherein
the first cooling body is thermally connected to the second main surface of the first substrate with the first insulating member being interposed,
the second cooling body is thermally connected to the fourth main surface of the second substrate with the second insulating member being interposed, and
the third cooling body is thermally connected to the sixth main surface of the third substrate with the third insulating member being interposed.

8. The power conversion device according to claim 1, wherein
the wiring member has a thickness not smaller than 0.05 mm and smaller than 0.3 mm and a current density not lower than 50 A/mm$^2$ and not higher than 100 A/mm$^2$.

9. The power conversion device according to claim 8, wherein
the wiring member includes a plurality of bent portions.

10. The power conversion device according to claim 9, wherein
adjacent bent portions of the plurality of bent portions are arranged as being superimposed on each other.

11. The power conversion device according to claim 1, wherein
the electronic component includes a fourth component,
the power conversion device further comprises:
a fourth substrate including a seventh main surface on which the fourth component of the electronic component is mounted and an eighth main surface opposed to the seventh main surface;
a fourth cooling body extending in the direction from the second main surface of the first substrate toward the first main surface; and
a fourth insulating member arranged between the eighth main surface of the fourth substrate and the fourth cooling body, and
the fourth cooling body is thermally connected to the eighth main surface of the fourth substrate with the fourth insulating member being interposed.

12. The power conversion device according to claim 1, wherein
the electronic component includes a fifth component,
the power conversion device further comprises:
a fifth substrate including a ninth main surface on which the fifth component of the electronic component is mounted and a tenth main surface opposed to the ninth main surface;
a fifth cooling body extending in the direction from the second main surface of the first substrate toward the first main surface; and
a fifth insulating member arranged between the tenth main surface of the fifth substrate and the fifth cooling body, and
the fifth cooling body is thermally connected to the tenth main surface of the fifth substrate with the fifth insulating member being interposed.

13. The power conversion device according to claim 1, wherein
a through hole to pass through the first main surface and the second main surface is provided in the first substrate, and
the through hole is arranged directly under the first joint portion.

14. The power conversion device according to claim 10, wherein
the bent portions come in contact with each other to shorten a conduction path in the wiring member.

15. The power conversion device according to claim 8, wherein
the wiring member includes a deflection inside of a space defined by cooling bodies.

16. The power conversion device according to claim 15, wherein
while the first cooling body and the second cooling body are assembled, the wiring member has a portion around a center curved like an arc and the curved wiring member is arranged on an inner side of the first substrate and the second substrate.

17. The power conversion device according to claim 16, wherein
the wiring member curved like the arc has curved portions in contact with each other.

18. The power conversion device according to claim 15, wherein
the wiring member is in contact with a core with a heat radiation member being interposed while the deflection is in a flexed state.

* * * * *